(12) United States Patent
Amit

(10) Patent No.: US 11,248,905 B2
(45) Date of Patent: Feb. 15, 2022

(54) MACHINE LEARNING IN METROLOGY MEASUREMENTS

(71) Applicant: KLA-TENCOR CORPORATION, Milpitas, CA (US)

(72) Inventor: Eran Amit, Haifa (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 719 days.

(21) Appl. No.: 15/750,972

(22) PCT Filed: Dec. 6, 2017

(86) PCT No.: PCT/US2017/064955
§ 371 (c)(1),
(2) Date: Feb. 7, 2018

(87) PCT Pub. No.: WO2019/035854
PCT Pub. Date: Feb. 21, 2019

(65) Prior Publication Data
US 2019/0086200 A1 Mar. 21, 2019

Related U.S. Application Data

(60) Provisional application No. 62/546,509, filed on Aug. 16, 2017.

(51) Int. Cl.
*G01B 11/27* (2006.01)
*G03F 7/00* (2006.01)
(Continued)

(52) U.S. Cl.
CPC ........ *G01B 11/272* (2013.01); *G03F 7/70633* (2013.01); *G03F 7/70683* (2013.01);
(Continued)

(58) Field of Classification Search
CPC .............. G01B 11/272; G01B 2210/56; G03F 7/70633; G03F 7/70683; G06N 99/00; G06N 20/00; G06F 30/398
See application file for complete search history.

(56) References Cited

U.S. PATENT DOCUMENTS 7,831,528 B2 * 11/2010 Doddi .................... G06N 20/00
706/12
8,863,063 B2 10/2014 Becker et al.
(Continued)

FOREIGN PATENT DOCUMENTS

WO WO 2016/123552 * 8/2016

OTHER PUBLICATIONS

Kim et al., Device based in-chip critical dimension and overlay metrology, Optics Express, vol. 17, No. 23, Nov. 9, 2009, pp. 21336-21343.
(Continued)

Primary Examiner — Alexander Satanovsky
Assistant Examiner — Lynda Dinh
(74) Attorney, Agent, or Firm — Hodgson Russ LLP

(57) ABSTRACT

Metrology methods and targets are provided, that expand metrological procedures beyond current technologies into multi-layered targets, quasi-periodic targets and device-like targets, without having to introduce offsets along the critical direction of the device design. Machine learning algorithm application to measurements and/or simulations of metrology measurements of metrology targets are disclosed for deriving metrology data such as overlays from multi-layered target and corresponding configurations of targets are provided to enable such measurements. Quasi-periodic targets which are based on device patterns are shown to improve the similarity between target and device designs. Offsets are introduced only in non-critical direction and/or sensitivity is
(Continued)

calibrated to enable, together with the solutions for multi-layer measurements and quasi-periodic target measurements, direct device optical metrology measurements.

20 Claims, 24 Drawing Sheets

(51) Int. Cl.
  *G06N 99/00*  (2019.01)
  *G06N 20/00*  (2019.01)
  *G06F 30/39*  (2020.01)
  *G03F 7/20*  (2006.01)
  *G06F 30/398*  (2020.01)
(52) U.S. Cl.
  CPC ......... *G06N 99/00* (2013.01); *G01B 2210/56* (2013.01); *G06F 30/398* (2020.01); *G06N 20/00* (2019.01)

(56) References Cited

U.S. PATENT DOCUMENTS

| | | | |
|---|---|---|---|
| 2006/0117293 A1 | 6/2006 | Smith et al. | |
| 2009/0244538 A1 | 10/2009 | Den Boef et al. | |
| 2011/0245955 A1* | 10/2011 | Li | G01B 11/24 700/104 |
| 2011/0255066 A1 | 10/2011 | Fuchs et al. | |
| 2014/0316730 A1 | 10/2014 | Shchegrov et al. | |
| 2015/0046121 A1* | 2/2015 | Dziura | G01N 21/9501 702/179 |
| 2015/0323316 A1* | 11/2015 | Shchegrov | G01B 11/27 702/150 |
| 2016/0109230 A1* | 4/2016 | Pandev | G01B 11/14 356/400 |
| 2016/0253450 A1 | 9/2016 | Kandel et al. | |
| 2016/0266505 A1* | 9/2016 | Amit | H01L 22/12 |
| 2016/0290796 A1* | 10/2016 | Levy | G03F 7/70616 |
| 2017/0060001 A1 | 3/2017 | Adel et al. | |
| 2017/0177760 A1* | 6/2017 | Socha | G03F 7/70625 |
| 2017/0255738 A1* | 9/2017 | Van Leest | G03F 7/70683 |
| 2017/0256465 A1* | 9/2017 | Van Leest | G03F 9/7003 |
| 2018/0358271 A1* | 12/2018 | David | G06N 7/005 |

OTHER PUBLICATIONS

ISA/KR, International Search Report for PCT/US2017/064955 dated May 15, 2018.

* cited by examiner

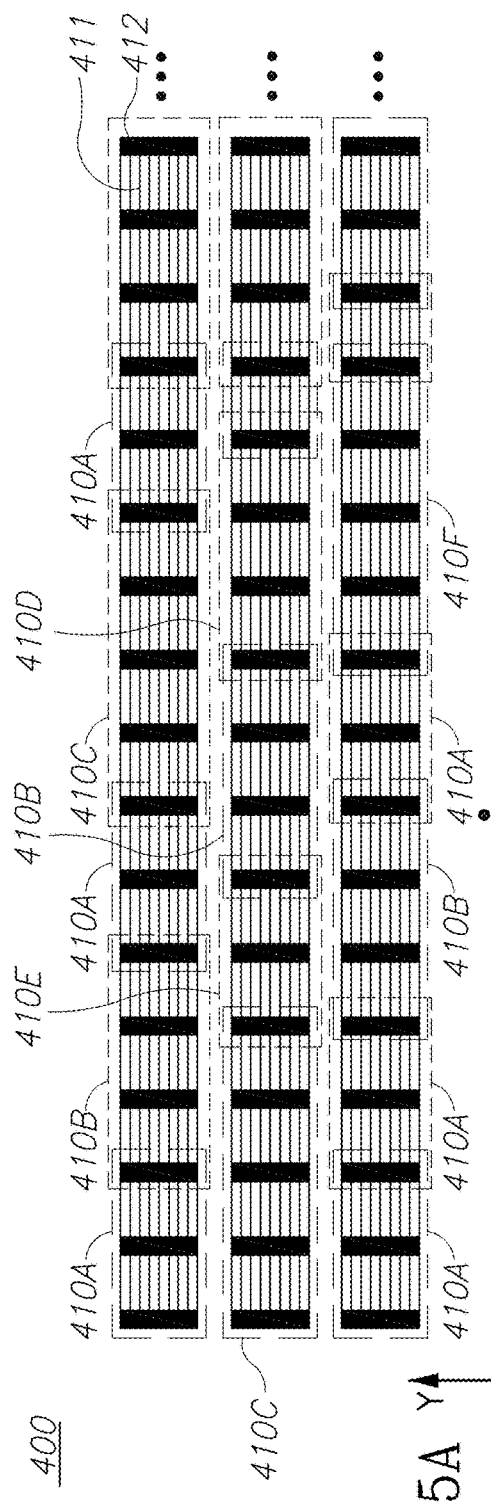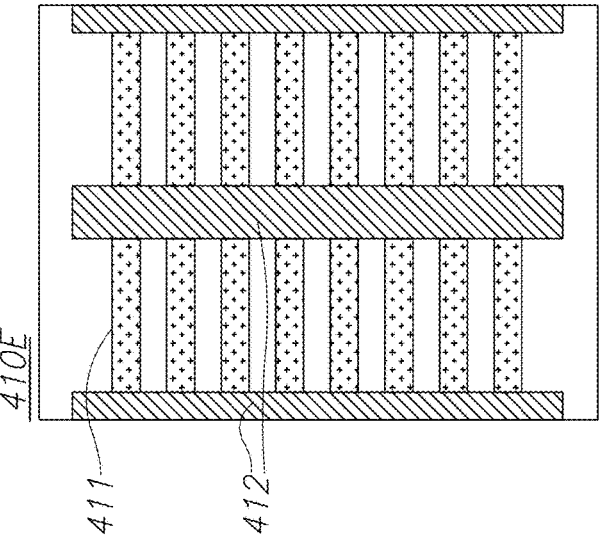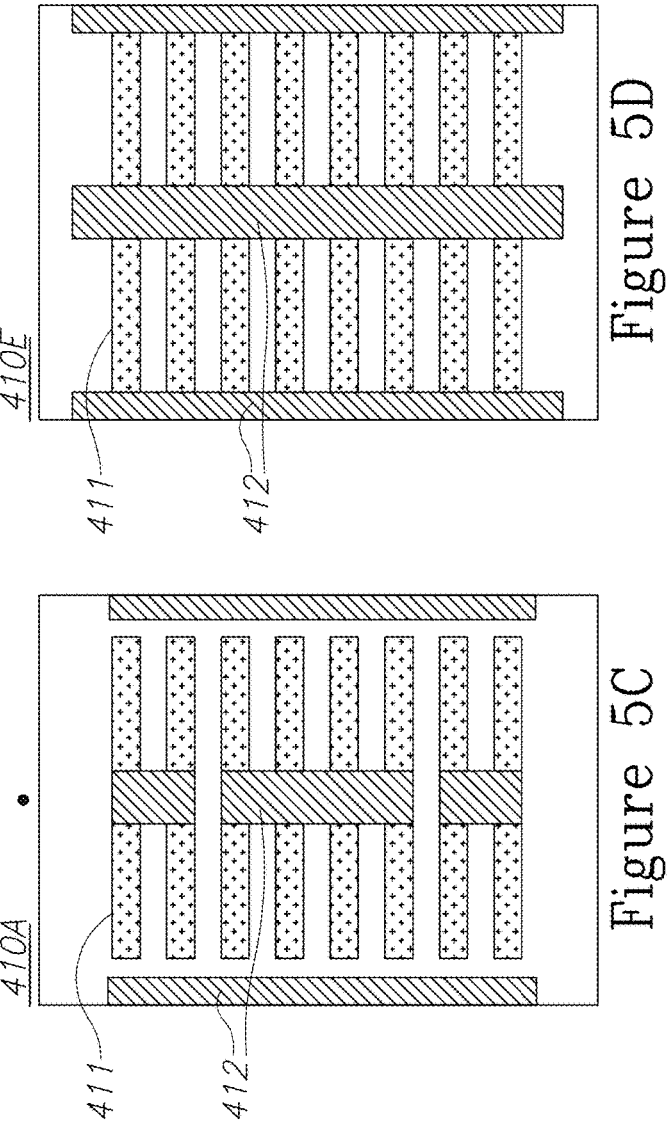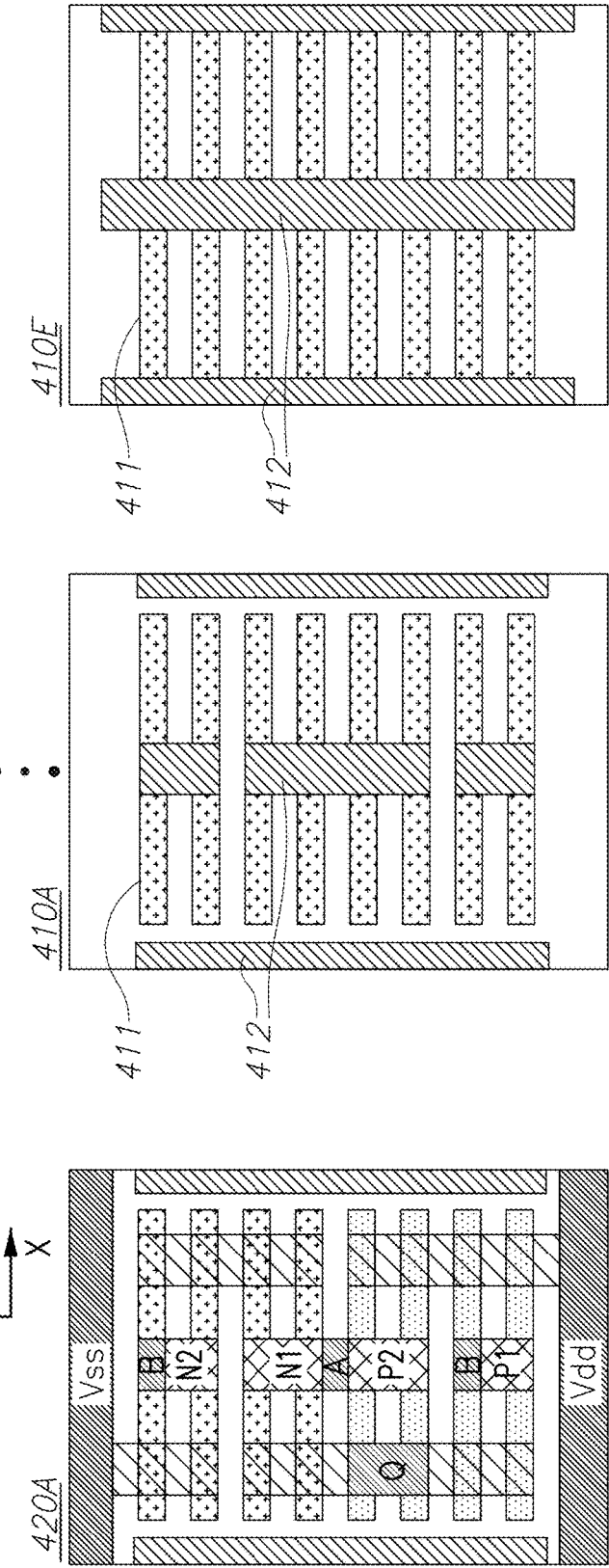
Figure 5A
Figure 5B
Figure 5C
Figure 5D

NAND

NOT

Vss: GROUND VOLTAGE
Vdd: POWER SUPPLY

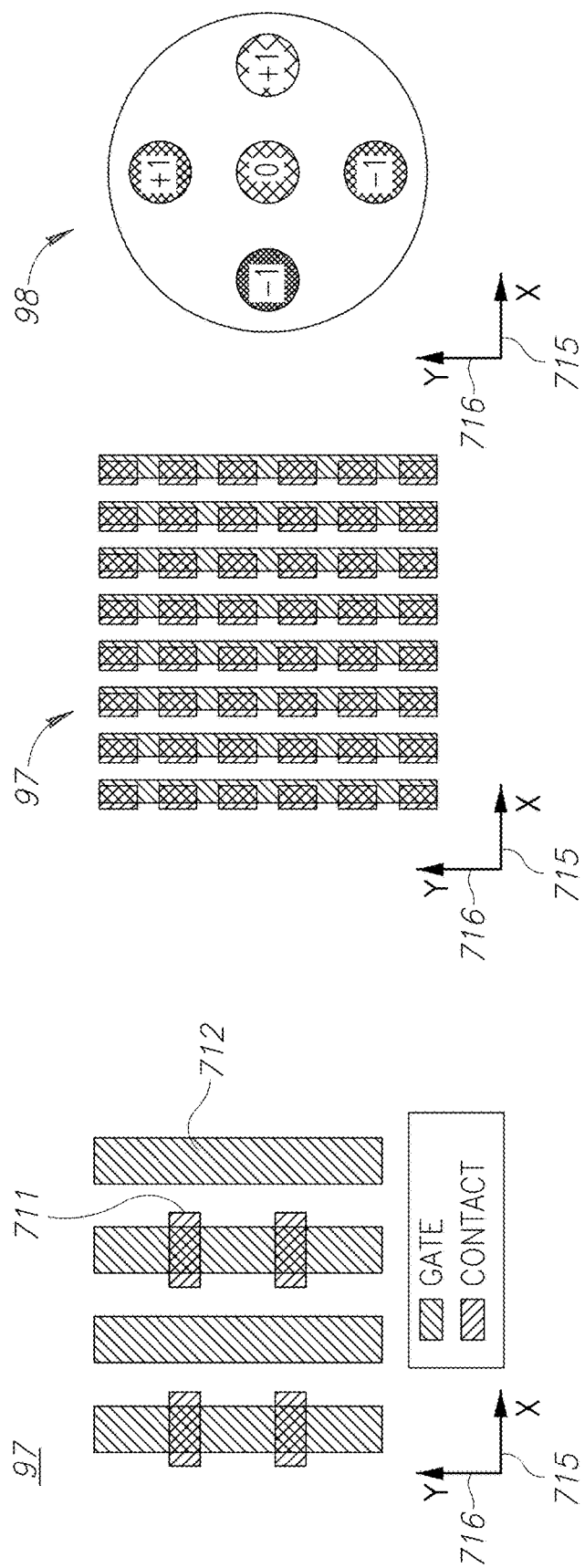
Figure 9
Figure 10
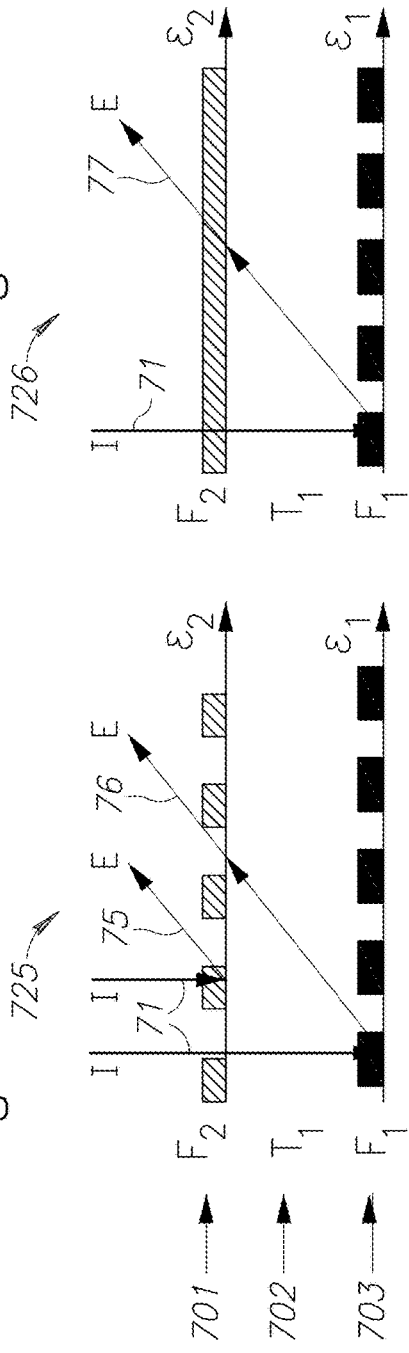
Figure 11

| INACCURACY (mm) | | CALIBRATION TARGETS (SECOND CELL 720) | | | | | | | | | | | | | | | WITHOUT CALIBRATION |
|---|---|---|---|---|---|---|---|---|---|---|---|---|---|---|---|---|---|
| | | 50 | | | | 100 | | | | 200 | | | | 300 | | | |
| CD1 | CD2 | 200 | 300 | 400 | 200 | 300 | 400 | 200 | 300 | 400 | 200 | 300 | 400 | 200 | 300 | 400 | |
| 50 | 200 | 0.0 | 0.6 | 0.3 | 0.9 | 1.3 | 1.4 | 1.2 | 1.2 | 0.9 | 1.3 | 1.3 | 1.2 | 1.4 | 1.4 | 1.4 | 5.0 |
| | 300 | 0.7 | 0.0 | 0.5 | 1.4 | 1.7 | 1.8 | 1.8 | 1.6 | 0.9 | 1.8 | 1.8 | 1.8 | 1.8 | 1.8 | 1.8 | 4.3 |
| | 400 | 0.6 | 0.9 | 0.0 | 1.7 | 2.7 | 2.7 | 2.5 | 2.3 | 1.6 | 2.6 | 2.6 | 2.5 | 2.8 | 2.7 | 2.7 | 9.8 |
| 100 | 200 | 0.5 | 0.6 | 0.4 | 0.0 | 0.6 | 0.5 | 0.3 | 0.2 | 0.6 | 0.5 | 0.4 | 0.4 | 0.5 | 0.5 | 0.5 | 0.8 |
| | 300 | 0.3 | 0.3 | 0.3 | 0.3 | 0.0 | 0.3 | 0.3 | 0.3 | 0.3 | 0.3 | 0.2 | 0.2 | 0.3 | 0.3 | 0.2 | 0.5 |
| | 400 | 0.7 | 0.8 | 0.7 | 0.6 | 0.5 | 0.0 | 0.2 | 0.4 | 0.8 | 0.1 | 0.1 | 0.2 | 0.1 | 0.1 | 0.1 | 1.7 |
| 200 | 200 | 41.6 | 28.9 | 41.6 | 22.7 | 25.2 | 5.8 | 0.2 | 16.6 | 79.8 | 3.5 | 1.7 | 3.1 | 6.8 | 5.6 | 4.2 | 19.9 |
| | 300 | 1.1 | 1.4 | 1.1 | 0.7 | 0.8 | 1.2 | 0.6 | 0.0 | 1.3 | 0.7 | 0.5 | 0.4 | 0.8 | 0.7 | 0.5 | 1.5 |
| | 400 | 0.4 | 0.4 | 0.4 | 0.6 | 0.8 | 0.8 | 0.7 | 0.7 | 0.0 | 0.8 | 0.8 | 0.8 | 0.8 | 0.8 | 0.8 | 0.9 |
| 300 | 200 | 4.3 | 5.0 | 4.6 | 3.5 | 3.0 | 0.6 | 0.8 | 2.9 | 4.9 | 0.0 | 0.6 | 0.9 | 0.5 | 0.3 | 0.8 | 24.0 |
| | 300 | 10.8 | 14.5 | 14.0 | 16.4 | 6.3 | 6.3 | 2.1 | 14.1 | 10.1 | 2.3 | 1.8 | 3.1 | 2.6 | 7.6 | 10.8 | 336.3 |
| | 400 | 24.4 | 67.2 | 41.9 | 53.9 | 272.8 | 9.6 | 12.2 | 14.1 | 34.6 | 7.6 | 0.0 | 0.0 | 6.4 | 7.7 | 2.5 | 9.7 |
| 400 | 200 | 3.1 | 3.7 | 3.4 | 2.7 | 2.3 | 0.5 | 0.8 | 2.2 | 3.6 | 0.3 | 0.7 | 0.9 | 0.0 | 0.2 | 0.8 | 12.5 |
| | 300 | 3.1 | 3.6 | 3.2 | 2.5 | 2.2 | 0.3 | 0.7 | 2.0 | 3.5 | 0.2 | 0.5 | 0.7 | 0.2 | 0.0 | 0.5 | 11.3 |
| | 400 | 7.7 | 8.3 | 8.1 | 18.9 | 6.6 | 3.5 | 1.9 | 9.2 | 8.1 | 2.9 | 4.2 | 2.9 | 11.3 | 288.2 | 0.1 | 16.6 |

910 — USING REFERENCE CALIBRATION TARGETS AND/OR DEVICE-ADJACENT CELLS WITH INTENDED OFFSETS TO ENABLE DIRECT MEASUREMENT OF DEVICE PARTS WITHOUT INTRODUCING OFFSETS INTO THE DEVICE DESIGN

915 — APPLYING MACHINE LEARNING ALGORITHM(S) TO CALIBRATE SENSITIVITY USING ANY OF: INTRODUCED OFFSETS ALONG NON-CRITICAL DIRECTION(S), ADJACENT TARGET CELLS WITH INTRODUCED OFFSETS, AND SENSITIVITY CALIBRATION TARGETS (E.G., ON SCRIBE LINES)

920 — EXTENDING THE CELL DESIGNS TO MULTI-LAYERED MEASUREMENTS

925 — CONFIGURING ADDITIONAL TARGETS TO PROVIDE LAYER-SPECIFIC METROLOGY PARAMETERS USING MULTI-LAYERED TARGET CELLS

930 — DIRECTLY MEASURING QUASI-PERIODIC DESIGN PATTERNS WHILE MANAGING AND BOUNDING THE RESULTING INACCURACIES

935 — MEASURING METROLOGY PARAMETERS FROM DEVICE PORTION(S) SELECTED TO HAVE IRREGULARLY REPEATING UNITS WITH DIFFERENT SETS OF LINES AND CUTS

Figure 16

MACHINE LEARNING IN METROLOGY MEASUREMENTS

CROSS REFERENCE TO RELATED APPLICATIONS

This application is a U.S. National Stage Entry of International Application No. PCT/US2017/064955 filed on Dec. 6, 2017, which claims the benefit of U.S. Provisional Patent Application No. 62/546,509 filed on Aug. 16, 2017, the entire disclosures of which are incorporated herein by reference.

BACKGROUND OF THE INVENTION

1. Technical Field

The present invention relates to the field of metrology, and more particularly, to the derivation of metrology measurements and improving targets and simulation results.

2. Discussion of Related Art

Metrology targets and methods aim at deriving measurements which represent the production accuracy of designed devices. Metrology faces the challenges of yielding measurable signals which reflect accurately properties of the devices, at a rate that is high enough and a real estate that is low enough, to minimize the hindrances to the production. Current metrology overlay (OVL) algorithms use special targets that have periodic structures in two layers, which are offset differently in different target cells.

U.S. Patent Application Publication No. 2016/0266505, which is incorporated herein by reference in its entirety, discloses on-device optical measurements and on-the-fly model-based measurement algorithms.

U.S. Patent Application Publication No. 2009/0244538, which is incorporated herein by reference in its entirety, discloses a lithographic apparatus arranged to transfer a pattern from a patterning device onto a substrate with a reference set of gratings provided in the substrate, the reference set including two reference gratings having line elements in a first direction and one reference grating having line elements in a second, perpendicular, direction. US 2009/0244538 requires identical (or very similar) designs for x and y in order to calculate the sensitivity of one direction and apply it to the second direction. However, this x-y design symmetry breaks in the device due to electrical functionality needs (and also the lithography process in critical layers is not symmetric).

U.S. Patent Application Publication No. 2011/0255066, which is incorporated herein by reference in its entirety, discloses measuring overlays using multiple targets in multiple fields, assuming that the overlay sensitivity of targets across the fields of the wafer is constant, ignoring intra-field process variations.

Young-Nam Kim et al. 2009 (Device based in-chip critical dimension and overlay metrology, Optics Express 17:23, 21336-21343), which is incorporated herein by reference in its entirety, discloses a model-based in-chip optical metrology technique that allows direct measurement of both critical dimensions and overlay displacement errors in the DRAM manufacturing process, performed on the actual semiconductor devices without requiring special target structures.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of directly measuring metrology parameters on devices, the method comprising: (i) measuring at least one metrology parameter from at least a portion of a device design that is selected to have a plurality of irregularly repeating units, having specified features such as different sets of lines and cuts, along at least one direction of the portion, and (ii) applying at least one machine learning algorithm to calibrate sensitivity using at least one of: an intensity of diffraction orders orthogonal to the at least one direction, introduced offsets along a non-critical direction, target cells with introduced offsets adjacent to the device portion, and at least one sensitivity calibration target, wherein the measuring is carried out scatterometrically on a plurality of targets to provide layer-specific metrology parameters, at least one of the targets being part of the device portion having N>2 overlapping layers, wherein the plurality of targets comprises at least one of: N cell pairs, each pair having opposite offsets at a different layer; N cells with selected intended offsets; N or fewer cells with selected intended offsets configured to utilize pupil information; and N-cell calibration targets alongside between N−1 and two overlay targets.

One aspect of the present invention provides a method comprising: configuring a multi-layered metrology target to have a plurality, M, of target cells over at least three, N≤M, target layers, each cell having at least one periodic structure in each layer and configuring the periodic structures of each cell to be offset with respect to each other by specified offsets, measuring, scatterometrically, at least M differential signals from the multi-layered metrology target, and applying at least one machine learning algorithm to the differential signals and to the specified offsets, to calculate scatterometry overlay (SCOL) metrology parameters from the M measurements of the multi-layered metrology target by solving a set of M equations that relate the SCOL metrology parameters to the differential signals and to the specified offsets.

One aspect of the present invention provides a method comprising measuring at least one metrology parameter in at least one target cell without introducing an intended offset along a critical measurement direction into the at least one target cell by applying at least one machine learning algorithm to calibrate at least one sensitivity parameter using offsets in at least one of: (i) an orthogonal, non-critical measurement direction and (ii) at least one additional target cell other than the at least one target cell.

One aspect of the present invention provides a method of directly measuring metrology parameters on devices which combines the above-mentioned methods synergistically.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 5A-5D and 6A-6F are high-level schematic illustrations of quasiperiodic SCOL targets, according to some embodiments of the invention.

FIGS. 9 and 10 are high-level schematic illustrations of device alignments, according to some embodiments of the invention.

FIG. 11 is a high-level schematic illustration of leading diffraction orders along the non-critical and critical measurement directions, according to some embodiments of the invention.

FIG. 13 presents a table with exemplary simulation results of the resulting sensitivity values for different combinations of the first and second cells designs, according to some embodiments of the invention.

DETAILED DESCRIPTION OF THE INVENTION

Figure 1A:
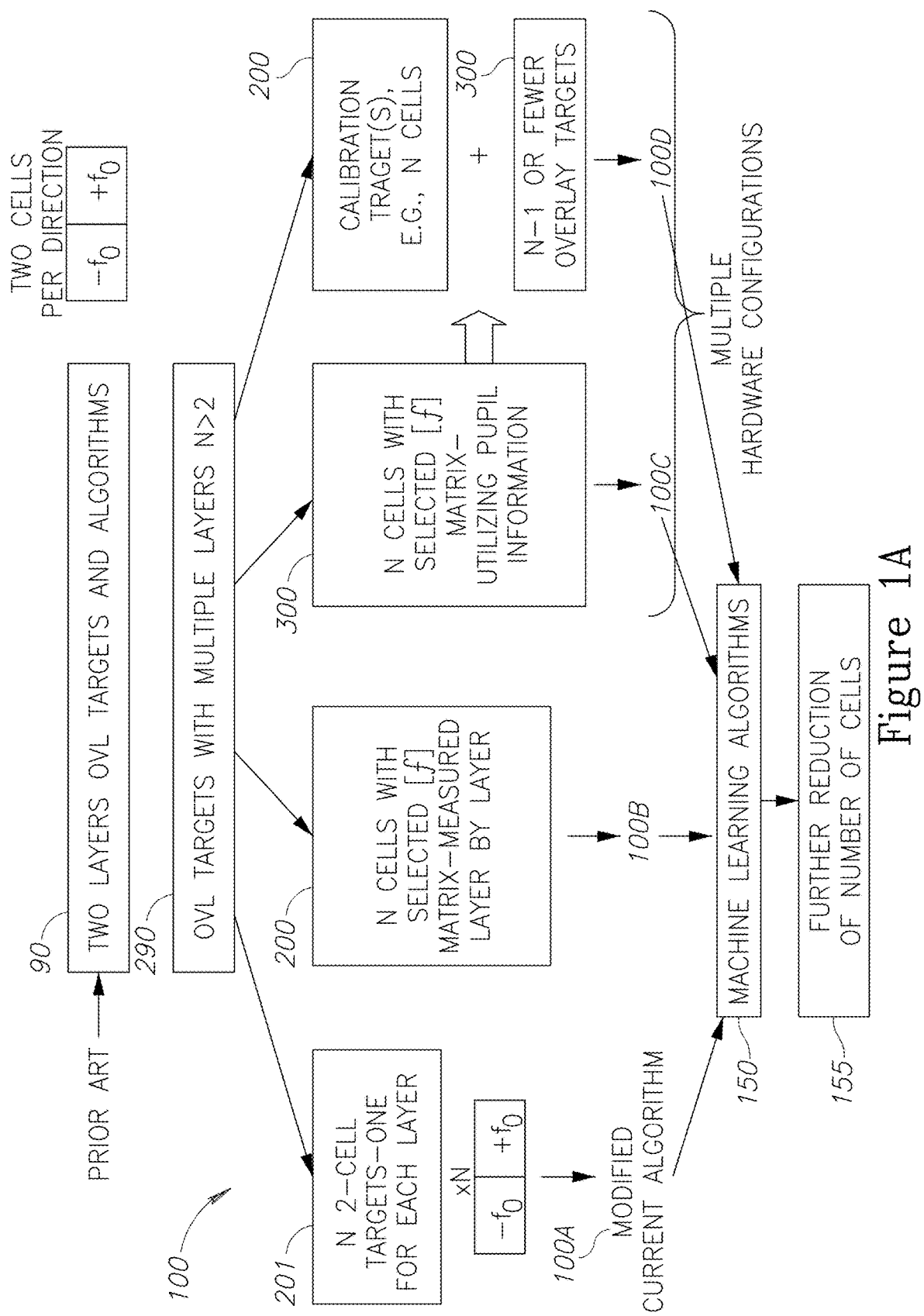
FIG. 1A is a high-level schematic overview illustration of multilayer targets and measurement methods thereof, according to some embodiments of the invention.

Prior to the detailed description being set forth, it may be helpful to set forth definitions of certain terms that will be used hereinafter.

The terms "metrology target" or "target" as used herein in this application, are defined as any structure designed or produced on a wafer which is used for metrological purposes. Specifically, overlay targets are designed to enable measurements of the overlay between two or more layers in a film stack that is produced on a wafer. Exemplary overlay targets are scatterometry targets, which are measured by scatterometry at the pupil plane and/or at the field plane, and imaging targets.

Exemplary scatterometry targets may comprise two or more either periodic or aperiodic structures (referred to in a non-limiting manner as gratings) which are located at different layers and may be designed and produced one above the other (termed "grating-over-grating") or one adjacent to another from a perpendicular point of view, termed "side-by-side"). Target designs include one or more cells, the term "cell" as used herein in this application, is defined as a part of a target that is used to derive a measurement signal. Common scatterometry targets are referred to as SCOL (scatterometry overlay) targets, DBO (diffraction based overlay) targets and so forth. Common imaging targets are referred to as Box-in-Box (BiB) targets, AIM (advance imaging metrology) targets, AIMid targets, Blossom targets and so forth. It is noted that in the present invention, SCOL is related to as being model-free in the sense that the details of measured stack must not be known prior to the measurements and that no modelling of the target is necessarily required in order to extract the parameters. It is further noted that the invention is not limited to any of these specific types, but may be carried out with respect to any target design.

Target elements comprise periodic structures, having elements repeating at one or more pitches, such as gratings. Certain metrology targets exhibit an "induced offset", also termed "intended offset", "designed offset" or "designed misalignment", which is, as used herein in this application, an intentional shift or overlay between the periodic structures of the target. The term "overlay" as used herein in this application, is defined as the overall offset, i.e. the intended offset plus an unintentional offset, between two layers of a target or a device. The unintentional offset may thus be derived by subtracting the intended shift from the measured overlay. Overlay targets are typically designed to have pairs of cells, the cells of each pair having equal and opposite intended offsets, denoted $\pm f_0$.

The term "periodic" as used herein in this application with respect to a target or a target structure, is defined as them having a recurring pattern. The term "strictly periodic" as used herein in this application refers to a target or a target structure which have a recurring unit cell which is identical at all recurrences. The term "quasi-periodic" as used herein in this application refers to a target or a target structure which have a recurring pattern which does not have a recurring unit cell but rather exhibits a basic pattern such as a grid that underlies the respective element as well as multiple aberrations, for example, changes in the length, width or details of the recurring pattern, and/or changes in grid parameters and features. These aberrations may be judiciously selected (as explained) and/or may be random and/or may reflect design considerations. The effect of the aberrations on the signal, i.e., the difference between signals derived from quasi-periodic targets and equivalent strictly periodic target is referred to in this application as "noise", which may have random and systematic components. The noise may be considered as part of the inaccuracy defined below (with respect to the strictly periodic design) and/or may be treated independently thereof.

The terms "device" or "device design" as used herein in this application, are defined as any part of the wafer which provides an operating electronic circuit, such as e.g., memory devices or logic devices. The term "critical direction" as used herein in this application, is defined as a direction in the device design which is sensitive to small offsets between layers (e.g., in the order of magnitude of 1 nm), with the device possibly malfunctioning if such offsets occur. The term "non-critical direction" as used herein in this application, is defined as a direction in the device design which can tolerate small offsets (e.g., in the order of magnitude of 1 nm), without the device malfunctioning if such offsets occur.

The term "measurement direction" as used herein in this application, is defined as a direction along which the overlay is measured. When periodic targets are used there must be periodicity in the measurement direction. The pitch is in the order of hundreds up to a few thousands of nanometers. In addition to this coarse pitch there may be a typically much smaller segmentation pitch of the features and\or a coarse pitch in the orthogonal direction.

It is noted that while the disclosure is aimed at optical illumination radiation, it may be extended to applications in which the illumination radiation is at very short wavelengths such as x ray and/or include particles beams.

With respect to metrology measurements, the term "differential signal" as used herein in this application, is defined as the intensity difference between two signals, such as the +1 and −1 diffraction order signals, measured from a target. The term "sensitivity" as used herein in this application, is defined as a ratio, or relation, between the differential signal and the overall offset, or overlay, between periodic structures along a respective measurement direction. The term "inaccuracy" as used herein in this application, is defined as a difference between a result of a measurement and the true value of the measured quantity (measurand). It is underlined that while the presented models are mostly linear, for clarity reasons, linearity is non-limiting in the sense that the algorithms may be adapted to utilize non-linear model, which are therefore part of the present disclosure as well.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and targets for measuring metrology parameters, in particular overlays and particularly using model-free far field optical metrology, using device designs directly. Specifically, the following disclosure overcomes the three major barriers that prohibit prior art direct device measurements, namely the multi-layer character of device designs, the non-periodic nature of device designs and the inherent constraint of having to avoid introduction of intended offset into actual device designs (in order not to damage their electrical properties and performance).

Metrology methods and targets are provided, that expand metrological procedures beyond current technologies into multi-layered targets, quasi-periodic targets and device-like targets, without having to introduce offsets along the critical direction of the device design. Machine learning algorithm application to measurements and/or simulations of metrology measurements of metrology targets are disclosed for deriving metrology data such as overlays from multi-layered target and corresponding configurations of targets are provided to enable such measurements. Quasi-periodic targets which are based on device patterns are shown to improve the similarity between target and device designs. Offsets are introduced only in non-critical direction and/or sensitivity is calibrated to enable, together with the solutions for multi-layer measurements and quasi-periodic target measurements, direct device optical metrology measurements.

The methods and targets are exemplified for optical scatterometry overlay (SCOL) measurements of device structures, which is a fast non-destructive overlay (OVL) technique. Its main limitation is the need for special targets due to its limited resolution. These metrology targets may have bad correlation with the actual device structures because of the big deviations between their designs and locations. It is therefore desired to measure directly the device in order to better reflect its OVL and other possible parameters of interest. The section labeled "multi-layer targets" provides methodologies which enable SCOL measurements of overlapping multiple parallel patterning. The section labeled "quasiperiodic targets" discloses how to handle device designs that lack a unit cell and are not strictly periodic as well as how to handle the signal to noise ratio in SCOL. Finally, the section labeled "avoiding offsets in device targets" presents innovative methods for sensitivity calculation without damaging the electrical properties. The disclosed methods, algorithms and target designs are combined synergistically into a complete solution for on-device optical OVL measurements.

The inventors have found out that while U.S. Patent Application Publication No. 2016/0266505 discloses analytic methods and models (mostly physics-based) that solve issues related to device characteristics (e.g., having complex multi-patterning structure, not being periodic, having electrical properties which are damaged by intended offsets required for SCOL targets) which are problematic in the context of overlay measurements and provides corresponding target designs—a complementary or alternative approach for extracting information from measurement signals may be using machine learning approaches. For example, machine learning algorithms may be trained on a cluster of signals and the corresponding desired metrology values to find correlations and functions to extract the required parameters. For example, machine learning algorithms may be used to reduce the number of required cells in multi-layer target designs, possibly down to a single cell.

In certain embodiments, the machine learning algorithms may be used to derive overlay sensitivity calibration based on on-the-fly information, where the information may come from different sources, such as: additional diffraction orders, orthogonal diffraction orders, a second target with different design etc. The machine learning methodology may be applied in relation to other methods for extracting the respective information to provide mutual enhancement of the efficiency of the respective method.

Multi-Layer Targets

First, multi-layer targets are disclosed together with corresponding measurement and signal derivation algorithms and machine learning algorithms based thereon, which enable their measurement with no or small throughput/real-estate penalty. The targets are discussed in a non-limiting manner in a one dimensional context and for scatterometry overlay (SCOL) targets. Such targets and methods are expected to improve upon current technologies at least on the following aspects: (i) The design and measurements of optical overlay (OVL) of in-die targets (which better reflect the device overlay) may be enabled; (ii) More flexibility in design of target dummification is provided, e.g., by allowing the features to be parallel to the measurement direction; and (iii) The real estate and\or throughput specifications may be improved.

The present invention overcomes the limitation of the standard scatterometry overlay algorithm, which requires that the overlay between two gratings is the only source of symmetry breaking. When additional gratings are present, their relative offsets may vary the signal in a way that cannot be treated using the standard overlay algorithm. This contaminates the original two-layer overlay signal and results in an inaccurate measurement. Moreover, the machine learning algorithms enable reduction in the number of cell per target, extraction of more information and/or faster extraction of information from the measurements, and improved target designs, with relation to parameters of the machine learning algorithms. The machine learning algorithms may be trained on target designs which are based on metrology simulations, to match a behavior of the target designs to a specified device patterns behavior.

FIG. 1A is a high-level schematic overview illustration of multilayer targets and measurement methods thereof, according to some embodiments of the invention. Prior art overlay targets and algorithms 90 relate to two-layered targets and respective overlay algorithms, which use at least two measurement cells having opposite predefined offsets $\pm f_0$ along each measurement direction. It is emphasized that applying prior art algorithms to targets with more than two layers results in an excessive number of variables due to the interaction between the illumination and the target layers. For example, prior art algorithms provide two equations (corresponding to the two target cells with opposite offsets) to derive two variables (the relative shifts between the layers, i.e. the overlay, and the coefficient A that related the overlay to the differential signal). In case of N>2 target layers, the two equations provided by prior art overlay algorithms are not sufficient to derive the overlays between the N layers.

The present disclosure proposes methods 100 and overlay targets 290 with three or more layers that enable extraction of various metrology parameters, represented herein by overlays, from multi-layered targets.

Certain embodiments propose using modified overlay algorithms, as a method 100A, to measure targets 201 having a plurality, N, of 2-cell targets, one cell pair for each of the N layers, all cells being identical but for a corresponding pair of cells for each layer, which have intended offsets $\pm f_0$ along the measurement direction. For example, each target may comprise two periodic layers configured to measure overlays between respective layers. The overlays may be derived from measurements of targets 201 by modified versions of prior art algorithms 90 which take into account the intermediate layers. However, this innovative solution suffers from the following drawbacks: (i) the targets are very different from the device (increasing the device-to-metrology bias) and (ii) the targets are less printable, even on the scribe-line, due to their being farther away from the desired process window. While it is possible to measure all overlays by modified SCOL algorithm 100A using targets 201, the following methods (100B-D) prove to be significantly more efficient in conserving real-estate and reducing MAM-time.

Machine learning algorithms 150 may be applied in association with any of methods 100A-D to enhance derivation accuracy, reduce errors, speed up the overall measurement time, reduce the required number of cells 155 and/or enable model-free on-the-fly metrology measurements of device-like targets. In certain embodiments, machine learning algorithm(s), may be trained on target designs which are based on metrology simulations, to match a behavior of the target designs to a specified device patterns' behavior.

Certain embodiments use a half of the number of cells, namely N cells (or more) for measuring N-layered targets by selecting the offsets judiciously, based on parameters of the machine learning algorithms applied to measurements of simulations. It is noted that disclosed methods may be used to replace or enhance methods derived from analytic approaches described in U.S. Patent Application Publication No. 2016/0266505. The inventors have found out that the analytic approach ensures the applicability and good convergence characteristics of the machine learning algorithms, while machine learning algorithms may enable avoiding some of the assumptions involved in the analytic approach.

Certain embodiments use even fewer cells, namely N−1 cells (or more) and possibly even fewer cells than N−1, for measuring N-layered targets by selecting the offsets judiciously and utilizing pupil information (information in signals measured at the pupil plane with respect to the target of the metrology tool's optical system). It is noted that using fewer than N cells per target is advantageous with respect to conservation of wafer real-estate and reduction of MAM (move-acquire-measure) time. It is noted that disclosed methods may be used to replace or enhance methods derived from analytic approaches described in U.S. Patent Application Publication No. 2016/0266505. The inventors have found out that the analytic approach ensures the applicability and good convergence characteristics of the machine learning algorithms, while machine learning algorithms may enable avoiding some of the assumptions involved in the analytic approach. Certain embodiments of the present invention comprise targets with n<2N cells, which, by applying machine learning algorithm(s), enable extraction of overlay information from the n<2N cells. In certain embodiments, the targets comprise a single cell per target which, by applying machine learning algorithm(s), enable model-free on-the-fly optical overlay measurements of the single cell.

Certain embodiments use even fewer cells, namely as few as two cells (or more) 300 set near devices for measuring N-layered targets by selecting the offsets judiciously and utilizing pupil information, as well as by using additional calibration targets 200 which may be positioned at regions farther away from the devices, e.g., on scribe lines, method 100D, targets 200, 300 and FIG. 1B below (it is noted that method 100D uses and further develops methods 100B, 100C and targets 200, 300)—as explained and exemplified in U.S. Patent Application Publication No. 20160266505. It is noted that disclosed methods may be used to replace or enhance methods derived from analytic approaches described in U.S. Patent Application Publication No. 20160266505. The inventors have found out that the analytic approach ensures the applicability and good convergence characteristics of the machine learning algorithms, while machine learning algorithms may enable avoiding some of the assumptions involved in the analytic approach.

In certain embodiments, the targets comprise a single cell per target which, by applying machine learning algorithm(s), enable model-free on-the-fly optical overlay measurements of the single cell.

Targets 290, 201, 200, 300 may be measured under different and possibly multiple hardware and illumination configurations, e.g., using different wavelengths and/or illumination modes, using different polarizations, using different apodizers or varying other elements in the optical system, to enhance calibrations and measurements, especially under applications of methods 100C and 100D. Machine learning algorithms 150 may be applied in combination with or in place of any of methods 100A-D, possibly to further reduce the required number of cells 155.

Figure 1B:
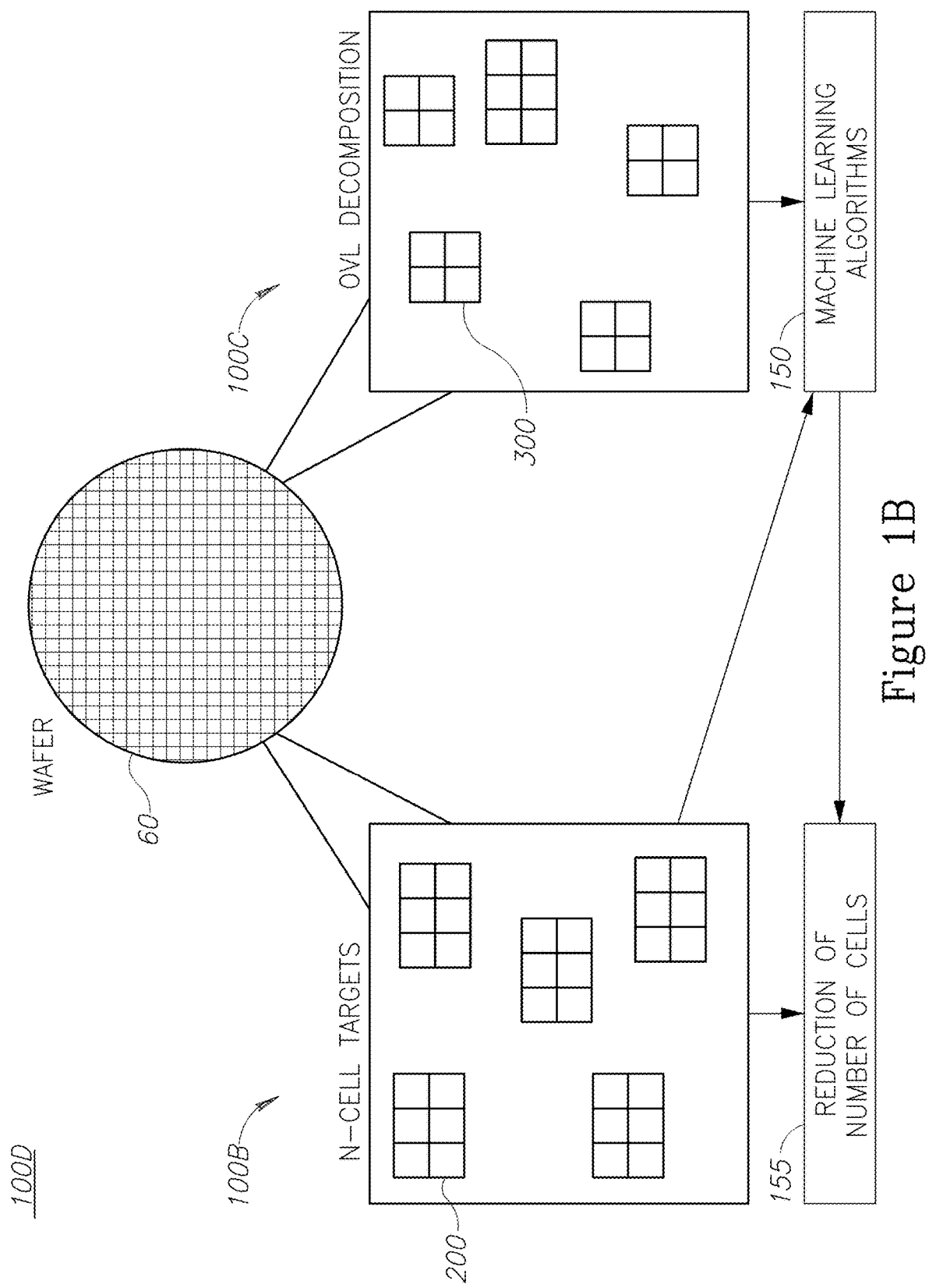
FIG. 1B is a high-level schematic illustration of two types of multilayer targets and measurement methods thereof, according to some embodiments of the invention.

FIG. 1B is a high-level schematic illustration of two types of multilayer targets 200, 300 and measurement methods 100 thereof, according to some embodiments of the invention. Machine learning algorithms 150 may enhance or replace first method 100B (that uses an analysis of the differential signals from the multi-grating targets) and/or second method 100C (that uses an approximated decomposition of the overlay reported by the standard algorithm). Both methods rely on using the full pupil information in order to extract the additional needed information. For each method, non-limiting examples for three-layer targets are shown, with the calculations needed in order to infer the overlay values. It is noted that the three-layer targets are used per measurement direction, i.e., with N=3 and two direction measurements X, Y, six cells are used to measure the overlays among the three layers in both directions. Clearly, targets may be similarly designed to provide measurement along a single (critical direction) only. Machine learning algorithms 150 may replace or enhance methods 100B, 100C, which are described in detail in U.S. Patent Application Publication No. 2016/0266505. Machine learning algorithms 150 may further be used to reduce the required number of cells 155.

Figure 2:
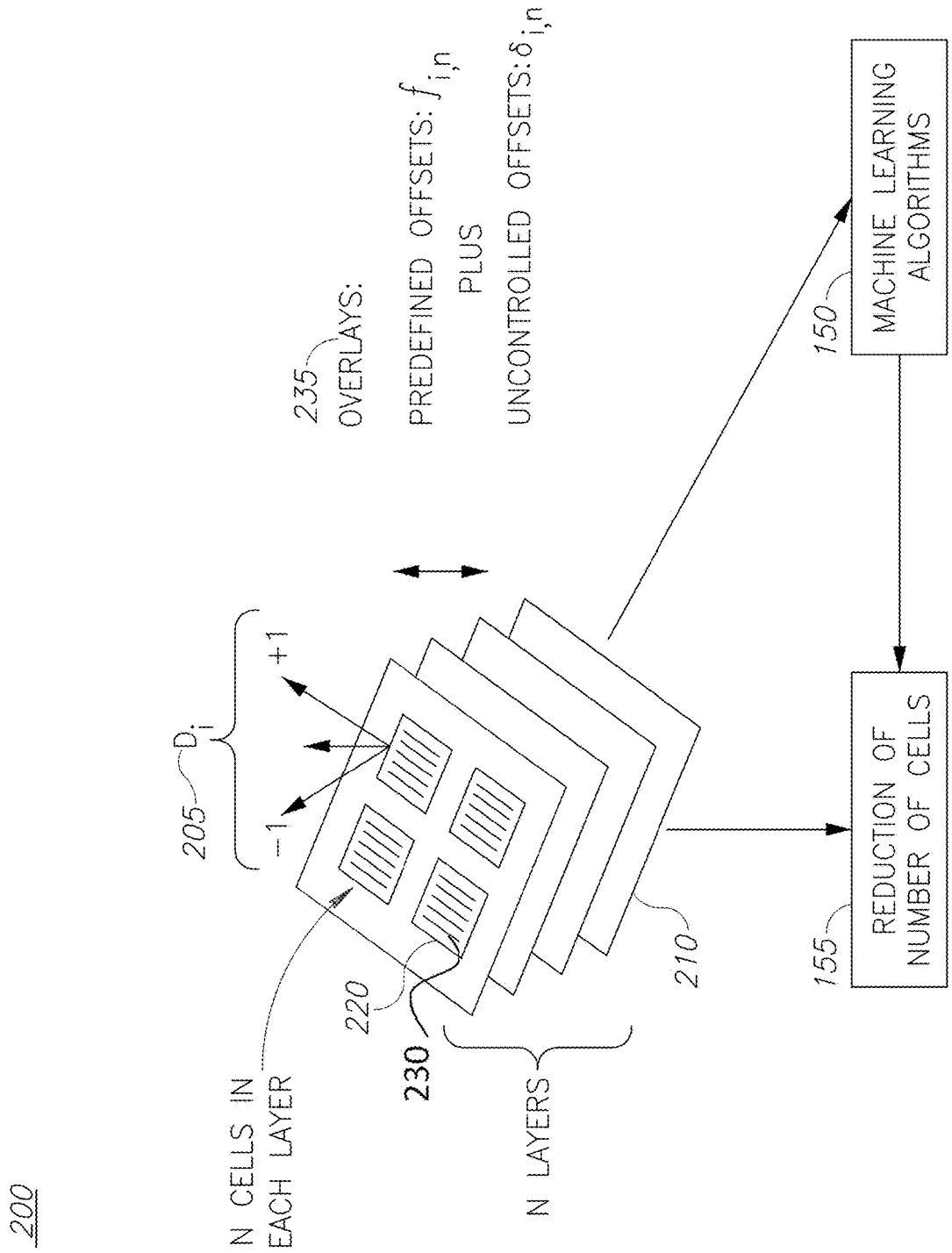
FIG. 2 is a high-level schematic illustration of multilayer targets, according to some embodiments of the invention.
Figure 3B:
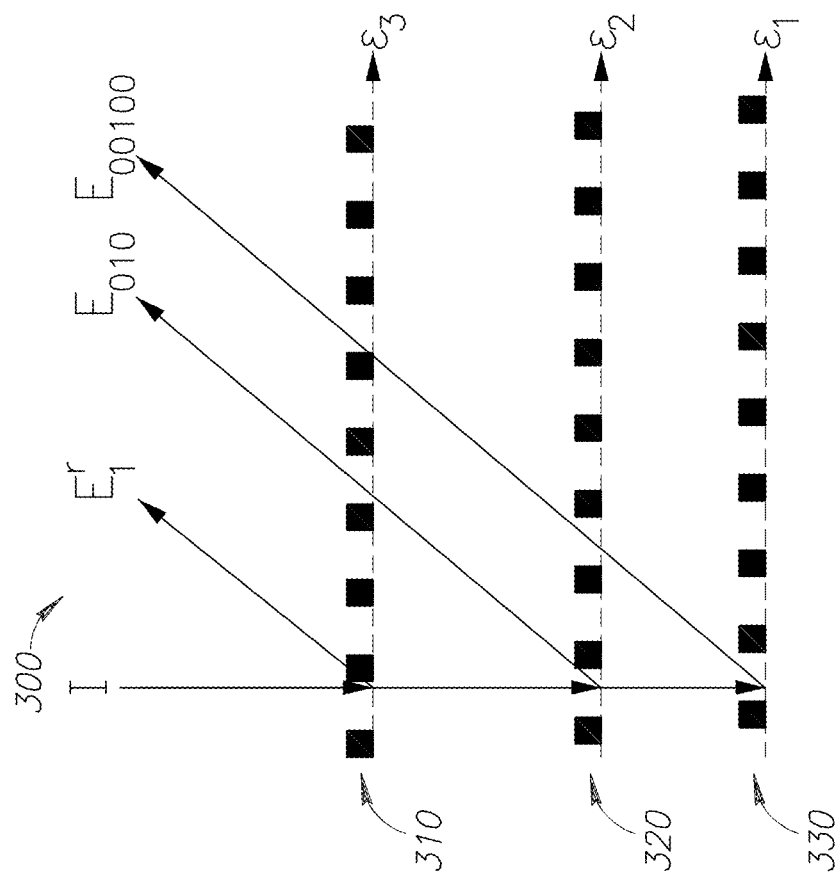
FIGS. 3A and 3B are high-level schematic illustrations of multilayer targets, according to some embodiments of the invention.
Figure 3A:
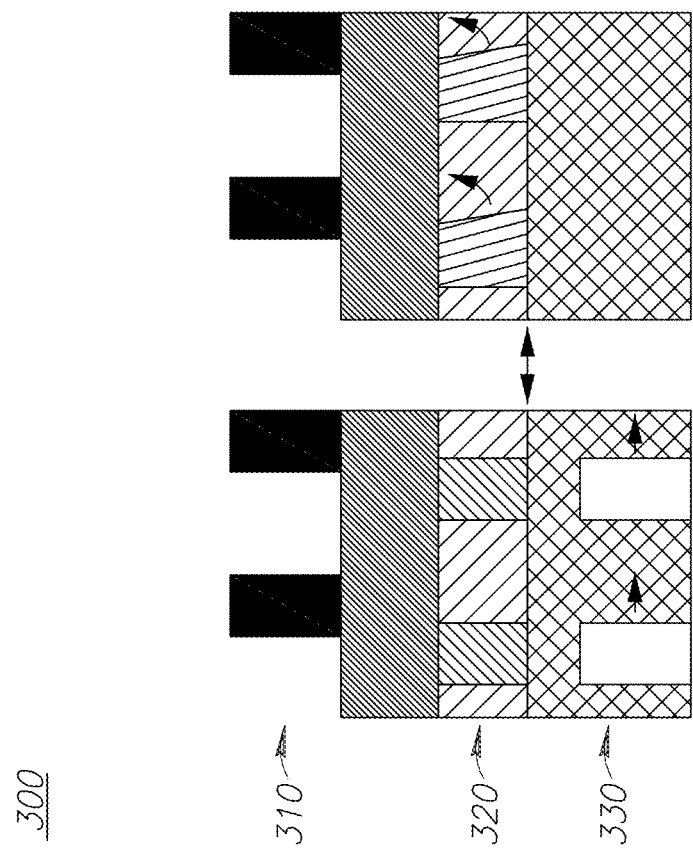

The following describes methods 100B, 100C as two non-exhaustive and non-limiting examples of method 100 of measuring overlay parameters in multilayer SCOL metrology targets, i.e., targets which employ a plurality of periodic structures (related to in the following, in a non-limiting manner as gratings), that are designed to be printed on wafers 60. Possible combinations of methods 100B and 100C are suggested after the principles of each method are explained. FIG. 2 is a high-level schematic illustration of multilayer targets 200, according to some embodiments of the invention. FIGS. 3A and 3B are high-level schematic illustrations of multilayer targets 300, according to some embodiments of the invention.

FIG. 2 schematically illustrates target 200 comprising N cells 220 in N layers 210, each cell 220 having at least one periodic structure 230. It is noted that the choice of an identical number (N) of cells and layers is made merely to simplify the explanation below, and does not limit the scope of the invention. The number of cells may be larger or smaller than the number of layers as well (for the latter possibility see additional derivations below). Periodic structures 230 are overlapping (one above the other) characterized by predefined (intended) offsets ($f_{i,n}$, relating to cell i and layer n) between cell layers 210, as well as by uncontrolled (unintended) offsets ($\delta_{i,n}$, relating to cell i and layer n) that are the aim of metrology method 100. Both offsets are derived from signals 205 by estimation of the respective overlays, which are influence by both types of offsets. The measured signal in first-order scatterometry overlay is the differential signal D 205, which is the intensity difference between the +1 and −1 diffraction orders when a target cell 220 is illuminated. Differential signal D 205 is used as a non-limiting example, as the disclosed methods may be used to measure differences between other diffraction orders as well as derived metrological measurements. The analytic approach to the measured signals provided in U.S. Patent Application Publication No. 2016/0266505 may be replaced or complemented by the disclosed machine learning algorithms, which may enable to avoid some of the assumptions involved in the analytic approach, while their convergence is suggested or possibly aided by the analytic approaches. Machine learning algorithms 150 may further be used to reduce the required number of cells 155.

Standard overlay targets have two layers and therefore two unknown parameters, and the two cells are used to provide the required two measured signals. Method 100 comprises the development of a new formalism that is required to handle more than two overlapping gratings, in order to distinguish between the effects of the offsets of the different layers on the signal. The inventors note that such challenge has not yet been handled due to the high-level of complexity involved in the design of the targets, in the theoretical analysis and in the practical measurement procedures, all of which are disclosed in the present invention. In the next sections two innovative formalisms (corresponding to procedures 100B and 100C) are described and demonstrated by simplified, non-limiting models. The inventors note that a person skilled in the art can easily expand these models to include additional contributions, e.g., higher diffraction orders, which are thus considered likewise a part of the present disclosure.

Method 100B uses the inspection of differential signals 205 from targets 200 to obtain overlays 235 (notated—OVL). Two variants of method 100B are presented—one assuming that the values of the previous OVLs are known, and a more advance variant that uses the pupil information in order to obtain all OVL values in the design, without a priori knowledge of the OVLs.

The second, more advanced variant of method 100, related to herein as method 100C, overcomes the need for all previous OVL values by combining the information from all the pixels within the pupil and using the fact that the previous OVL values do not depend on the pixel position. The latter observation is used to define a cost function $\Omega$ which has a zero differential with respect to any OVL value (the example is with respect to $OVL_1$, in a non-limiting manner) as expressed and developed in U.S. Patent Application Publication No. 2016/0266505. Machine learning algorithms 150 may be applied in combination with or in place of methods 100B and/or 100C, to enhance derivation accuracy, reduce errors, speed up the overall measurement time, reduce the required number of cells 155 and/or enable model-free on-the-fly metrology measurements of device-like targets.

FIGS. 3A and 3B are high-level schematic illustrations of multilayer targets 300, according to some embodiments of the invention. FIGS. 3A and 3B illustrate in a non-limiting manner three-layered target 300, the disclosed principles may be implemented to multi-layered targets by a person skilled in the art, hence the latter are considered likewise part of the disclosed invention.

Multilayer targets are not used in the prior art since the additional layers (beyond two) are an additional symmetry breaking source which contaminates the overlay signal from the two layers and results in inaccurate measurement. In the following, the one or more additional layer(s) are treated as inaccuracy source and their effect on the signal is characterized. The characterization is used (i) to eliminate the inaccuracy contribution of the additional layer(s) to the overlay of an original two-layered target (which may be selected arbitrarily in target 300); and (ii) to calculate the offset of the additional layer(s) with respect to the original layers. These are part of method 100D (see FIG. 1A), which may replace and/or augment methods 100B and 100C of measuring multilayered targets 200, which was described above. Particularly, the distinction between targets 200 and 300 is made merely to clarify the explanations and not to limit the scope of the invention, as clearly multi-layered targets may be designed to combine the features of targets 200 and 300.

FIG. 3A schematically illustrates a non-limiting case, in which top and intermediate layers 310, 320, respectively, are regarded as the original layers for which an overlay is to be calculated, while bottom layer 330 (which may be replaced by multiple layers) is regarded as the inaccuracy source. The effect of the bottom layer offset with respect to the intermediate layer is similar to a symmetry breaking due to side wall angle asymmetry. FIG. 3B schematically illustrates three layered target 300 with designation of the refracted electric fields as defined below, upon illumination I. It is assumed for the sake of simplicity, in a non-limiting manner, that the periodic structures in layers 310, 320, 330 are parallel gratings with identical pitches. It is further assumed, in a non-limiting manner, that the leading orders of the refracted electric field are $E_1^r$—the first order signal refracted off top grating 310, $E_{010}$—the field transmitted through top grating 310, refracted to the first order off middle grating 320, and transmitted through top grating 310, and $E_{00100}$—the field transmitted through top and middle gratings 310, 320 respectively, refracted to the first order off bottom grating 330, and transmitted through middle and top gratings 320, 310, respectively, as illustrated in FIG. 3B. The corresponding intensity of each of these fields is $I_1^r = |E_1^r|^2$, $I_{010} = |E_{010}|^2$, and $|E_{00100}|^2$.

The analytic approach to the measured signals provided in U.S. Patent Application Publication No. 2016/0266505, under the assumptions stated above, may be replaced or complemented by the disclosed machine learning algorithms, which may enable to avoid some of the assumptions involved in the analytic approach, while their convergence is suggested or possibly aided by the analytic approaches. For example, the analytic approach of U.S. Patent Application Publication No. 2016/0266505 illustrates that the measured overlay per pixel can be separated into the overlay between the top layers and a term that depends on the bottom layer offset. In another example, the analytic approach separates the variables momentum dependency and bottom-layer off-set. Such indications may support the application of the machine learning algorithms and help identify useful parameters of the machine learning algorithms, to be used as input for measurement and target design methods.

The calibration may be applied to the full sampling or to the next wafers. Alternatively or complementarily, the differential signal analysis (methods 100B, 100C, possibly enhanced by machine learning algorithms) may be applied to the calibration targets. (iii) Subsampling may be measured across the wafers at dedicated targets positioned next to external reference targets and the matching between the targets may be optimized. The calibration may be applied to the full sampling or to the next wafers. (iv) A principal-component analysis (PCA) may be performed on the subsamples to give the relative measure of $\tilde{f}(k)$, and the absolute value can be calculated since the OVL is obtained from the multi-cell targets, as described above. In certain embodiments, machine learning algorithms 150 may be used in relation to the PCA, e.g. before the PCA, after the PCA, using principal components of the PCA for the machine learning algorithms and/or using machine learning algorithms possibly to improve the derivation of the principal components.

Returning to FIG. 1B, certain embodiments of method 100D may combine the use of methods 100B and 100C. For example, two-cell targets 300 may be printed on the wafer, together with a smaller number of (dedicated, calibration) multi-cell targets 200 (i.e., targets having three cells or more). Multi-cell targets 200 may be sampled in order to obtain the $\tilde{f}(k)$ function, either by the overlay decomposition method, or by inspecting the resulting differential signals and obtaining $\tilde{f}(k)$ from differential signal analysis method 100B. Machine learning algorithms 150 may be applied in association with of method 100D described below and in U.S. Patent Application Publication No. 2016/0266505, to enhance derivation accuracy, reduce errors, speed up the overall measurement time, reduce the required number of cells 155 and/or enable model-free on-the-fly metrology measurements of device-like targets. In certain embodiments, machine learning algorithm(s), may be trained on target designs which are based on metrology simulations, to match a behavior of the target designs to a specified device patterns' behavior.

It is noted that the assumption of three periodic structures (gratings) is a non-limiting one, presented here for simplification purposes only. In case of two (or more) measurement directions, respective periodic structures may be added. In order to conserve wafer real-estate, calibration multi-cell targets 200 may be relative few while measurements of two-cell targets 300 may be carried out using the calibration derived therefrom.

More specifically, by studying the OVL distribution across the pupil in a linearity array of the bottom grating, $\tilde{f}(k)$ may be extracted (for example—using principal component analysis and/or machine learning algorithms 150). For all other sites on the wafer the "OVL" can be separated into $OVL_{23}$ ("common to all pixels") and $OVL_{12}$ ("per pixel inaccuracy"), as described in detail in U.S. Patent Application Publication No. 2016/0266505, enabling dedicated multi-layered target measurements using two cells (of three layers). Respective metrology measurements of any of targets 290, 201, 200, 300 and application of machine learning algorithms 150 thereto are also considered part of the present disclosure.

Figure 4:
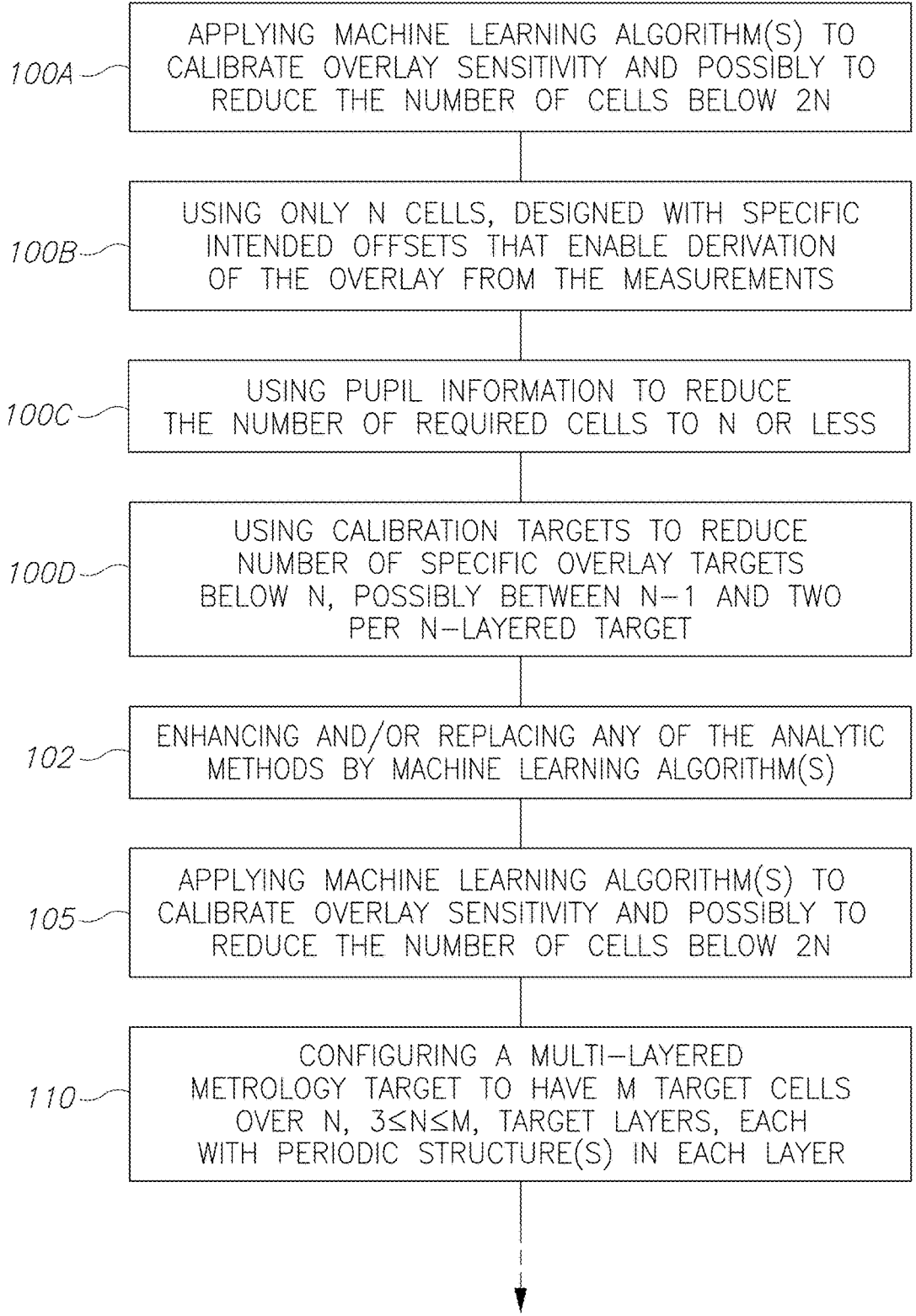
FIG. 4 is a high-level flowchart illustrating method, according to some embodiments of the invention.
Figure 4:
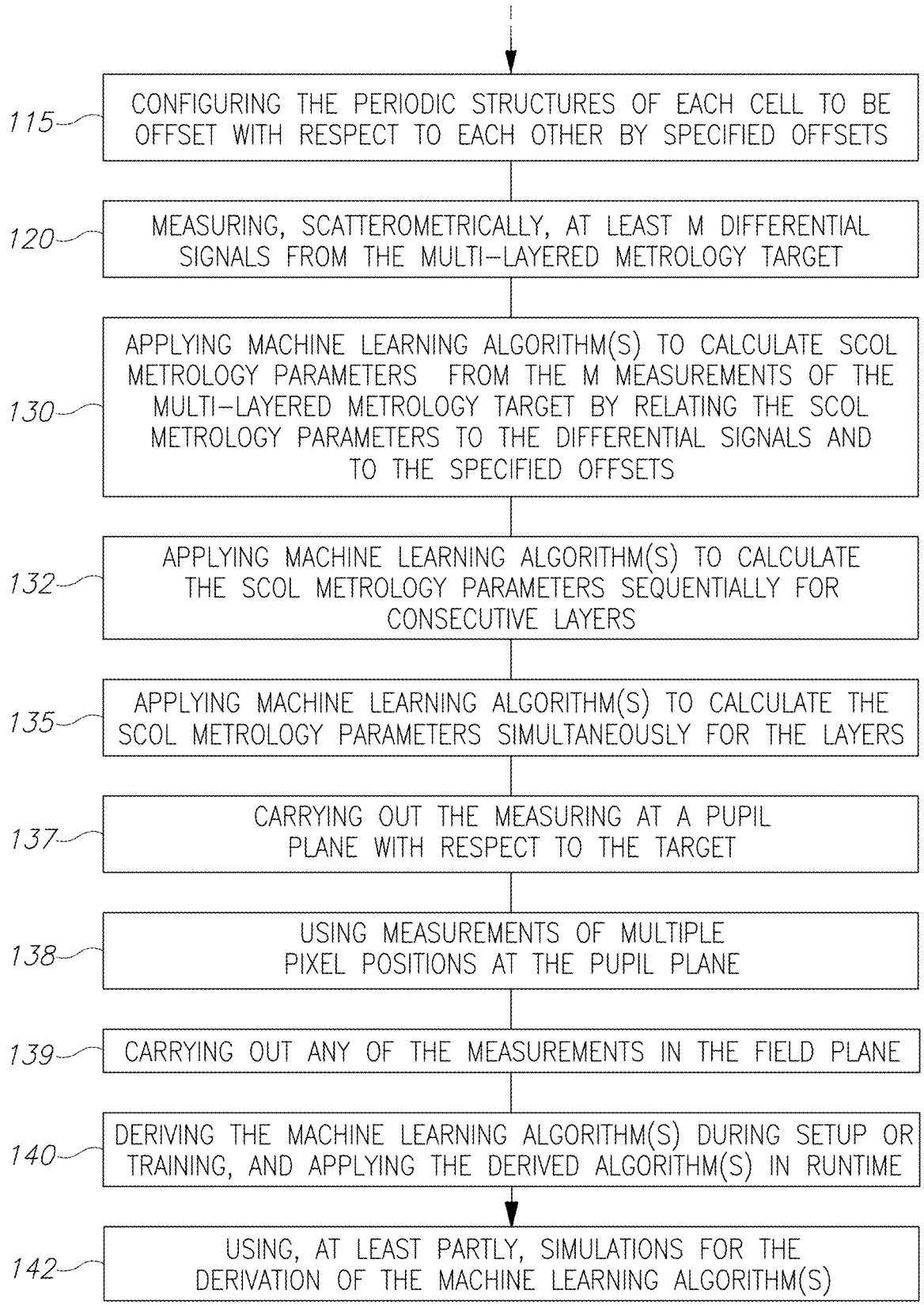

FIG. 4 is a high-level flowchart illustrating method 100, according to some embodiments of the invention. Method 100 may be carried out at least partially by at least one computer processor. Computer program products and corresponding metrology modules are provided, which comprise a computer readable storage medium having computer readable program embodied therewith and configured to carry out method 100 at least partially. Target design files as well as metrology measurements of the targets are also provided.

Method 100 may comprise any of the following, separate or combined: modifying current OVL algorithms to operate on N cell pairs (2N cells), each pair with opposite offsets in one layer (method 100A) (e.g., each target with two periodic layers configured to measure overlays between respective layers); using only N cells, designed with specific intended offsets that enable derivation of the overlay of the measurements (method 100B); using pupil information to reduce the number of required cells to N−1 (method 100C), and using calibration targets to reduce the number of specific overlay targets below N−1, possibly down to 2 per N-layered target (method 100D).

Method 100 may further comprise enhancing and/or replacing any of the analytic methods (100A-100D) by machine learning algorithm(s) 150 (stage 102). In certain embodiments, method 100 may comprise applying machine learning algorithm(s) to calibrate overlay sensitivity and possibly to reduce the number of cells below 2N (stage 105).

Method 100 may comprise configuring a multi-layered metrology target to have a plurality, M, of target cells over at least three, N≤M, target layers, each cell having at least one periodic structure in each layer (stage 110) and configuring the periodic structures of each cell to be offset with respect to each other by specified offsets (stage 115). Method 100 may comprise measuring, scatterometrically, at least M differential signals from the multi-layered metrology target (stage 120), and applying machine learning algorithm(s) to calculate SCOL metrology parameters from the M measurements of the multi-layered metrology target by relating the SCOL metrology parameters to the differential signals and to the specified offsets (stage 130). The SCOL metrology parameters may be overlays between the N layers. Applying machine learning algorithm(s) 130 to calculate the SCOL metrology parameters may be carried out sequentially for consecutive layers (stage 132), e.g., as in first variant 100B of method 100 described above. For example, the SCOL metrology parameters may be overlays between the N layers, and the machine learning algorithm(s) may be applied in relation to the analytic model described in U.S. Patent Application Publication No. 2016/0266505.

Alternatively or complementarily, applying machine learning algorithm(s) 130 to calculate the SCOL metrology parameters may be carried out simultaneously for the layers (stage 135), e.g., as in second variant 100C of method 100 described above, by carrying out the measuring at a pupil plane with respect to the target (stage 137) and using measurements of a plurality of pixel positions at the pupil plane (stage 138). For example, the SCOL metrology parameters may be overlays between the N layers, and the machine learning algorithm(s) may be applied in relation to the analytic model described in U.S. Patent Application Publication No. 20160266505. In a non-limiting example, N=3, the SCOL metrology parameters are overlays between the three layers, and the machine learning algorithm(s) may be applied in relation to the analytic model described in U.S. Patent Application Publication No. 20160266505. In certain embodiments, any of the measurements may be carried out in the field plane (stage 139).

In certain embodiments, method 100 may comprise deriving the machine learning algorithm(s) (e.g., stages 120 and/or 130) during setup or training, e.g., once, and applying the derived algorithm(s) (e.g., stages 135) in runtime (stage 140), possibly adjusting the derived algorithms if needed. Certain embodiments comprise using, at least partly, simulations for the derivation of the machine learning algorithm(s) (stage 142).

Certain embodiments comprise multi-layered metrology targets having a plurality of target cells over at least three target layers, each cell having at least one periodic structure in each layer, with the periodic structures of each cell being offset with respect to each other by specified offsets. The targets may provide SCOL measurements which are likewise part of the present disclosure.

Method 100 provides multiple novel aspects, such as: The measurement of SCOL targets with more than two overlapping parallel gratings with minimal inaccuracy penalty; Combination of two-cell and multiple-cell targets sampling for accurate measurements of multiple overlapping grating targets; Targets and measurement methods which follow all in-die device layout restrictions including lateral and vertical constrains with no inaccuracy penalty; Multi-cell multi-grating targets and measurement methods for improved throughput and/or real estate; Target design optimization based on simulations taking into account all process and lithography steps and resultant patterns, rather than only the two specific desired layers; Optimization of all layer patterns based on an analytic model—the model predicts the optimal optical properties minimizing undesired contributions to the signal; Use of information across the pupil such as reflectivity, differential signals and/or overlay in order to get the accurate overlay per layer; the combination of the aforementioned per-pixel response with multi-cell overlay calculation in order to obtain a calibration for the standard algorithm such that the desired overlay can be obtained from a two-cell target; and application of machine learning algorithms to any of the above.

Quasiperiodic Targets

In the following, examples of quasiperiodic SCOL targets are presented, which are more similar to device patterns and are periodic at predefined scales, but are not lattices. This means that the full structure cannot be divided into smaller identical structures (unit cells). It is noted below, that actual device patterns may also, under certain circumstances which are described below, considered quasiperiodic SCOL targets, and as shown below, do not have to include the intended shifts. Hence the following disclosure enables measuring overlay of certain device designs directly, in spite of their non-periodicity.

Machine learning algorithms may be applied on the measurements of the disclosed targets to enhance results derivation accuracy, reduce errors, speed up the overall measurement time, reduce the required number of cells and/or enable model-free on-the-fly metrology measurements of device-like targets. In certain embodiments, machine learning algorithm(s), may be trained on target designs which are based on metrology simulations, to match a behavior of the target designs to a specified device patterns' behavior.

FIGS. 5A-5D and 6A-6F are high-level schematic illustrations of quasiperiodic SCOL targets 400, according to some embodiments of the invention. Targets 400 exemplify targets which fulfill the requirements of various OVL/alignment techniques (e.g., SCOL, AIM, scanner alignment marks) for periodic target, yet are not periodic in the sense that targets 400 do not have a unit cell. While targets 400 have no repeating unit cell, the Fourier transform of targets 400 does reveal periodicity at some defined length scales corresponding to an effective target pitch at an additional length scale, which may be much bigger than the actual fine scale pitch. In the analysis of the measurements of targets 400, the random parts which break the translation symmetry may be treated as "noise" and may be averaged out using measurements of large areas or using multiple measurements of different target areas. Alternatively or additionally, measurement conditions may be chosen to minimize the contribution of translation-variant features, or their contribution may be eliminated using sophisticated signal analysis, target design and/or hardware, as exemplified below. Respective metrology measurements of targets 400 are also considered part of the present disclosure.

In FIG. 5A, target 400 is illustrated schematically using a basic pattern of horizontal and vertical lines to indicate the quasi-periodic nature of target 400 (X and Y axes illustrate two measurement axes, the periodicity along the Y axis may correspond to the pitch in standard SCOL targets). It is noted that in the details, elements 410A-410F etc. of which target 400 is composed, each includes gaps and cuts which modify the elements and target 400 as a whole from being a regular grid, making target 400 grid-based but incorporating multiple irregularities that are derived from device patterns as illustrated in FIGS. 5B and 5C in an exemplary manner. FIGS. 6A-6F further elaborate on this aspect by denoting target 400 as being made of blocks 410A-410F etc. (FIG. 6A) which are designed as schematic representations or abstractions of device patterns (FIGS. 6B-6E) and may be combined to form quasi-periodic targets 400 (FIG. 6F). It is emphasized that all block designs are based on a similar periodicity that is represented by the respective grids, yet include multiple irregularities or aberrations from the grid symmetry, which overall yield quasi-periodic target 400.

FIG. 5B is a high-level schematic illustration of a simplified device layout 420 (e.g., a NAND gate layout) as a basis for pattern 410A exemplified in FIG. 5C. Pattern 410A comprise specified features, e.g., features that may be derived from device layout 420 by further simplification, such as maintaining rows 411 from device layout 420 and using various types of cuts 412 (analogous to metal lines connecting the rows in the actual device layout) to yield pattern 410A as well as alternative patterns such as pattern 410E illustrated in FIG. 5D. FIG. 5A schematically illustrates a combination of a plurality of patterns denoted by 410A, 410B, 410C, 410D, 410E, 410F etc. which may likewise be variations on the dimensions of pattern 410A and/or on the configuration of cuts 412 in it. Target 400 may thus be described as superposition of repeating unit cell and varying cuts, and/or may be designed to lack a defined repeating unit cell altogether. Different cuts in patterns 410A-F may be selected to represent different logic gates. The illustrated design may be provided for one or more layers of target 400. It is noted that the illustrated lines and cuts may be the result of multiple lithography steps (e.g., possibly creating the lines with pitch multiplication processes) and then possibly multiple applications of cuts. The patterns may however also be carried out in a single lithography step. The illustrated lines and cuts serve to provide a non-limiting example for specified features of the patterns, and may be replaced with other features with respect to device design.

Figure 6A:
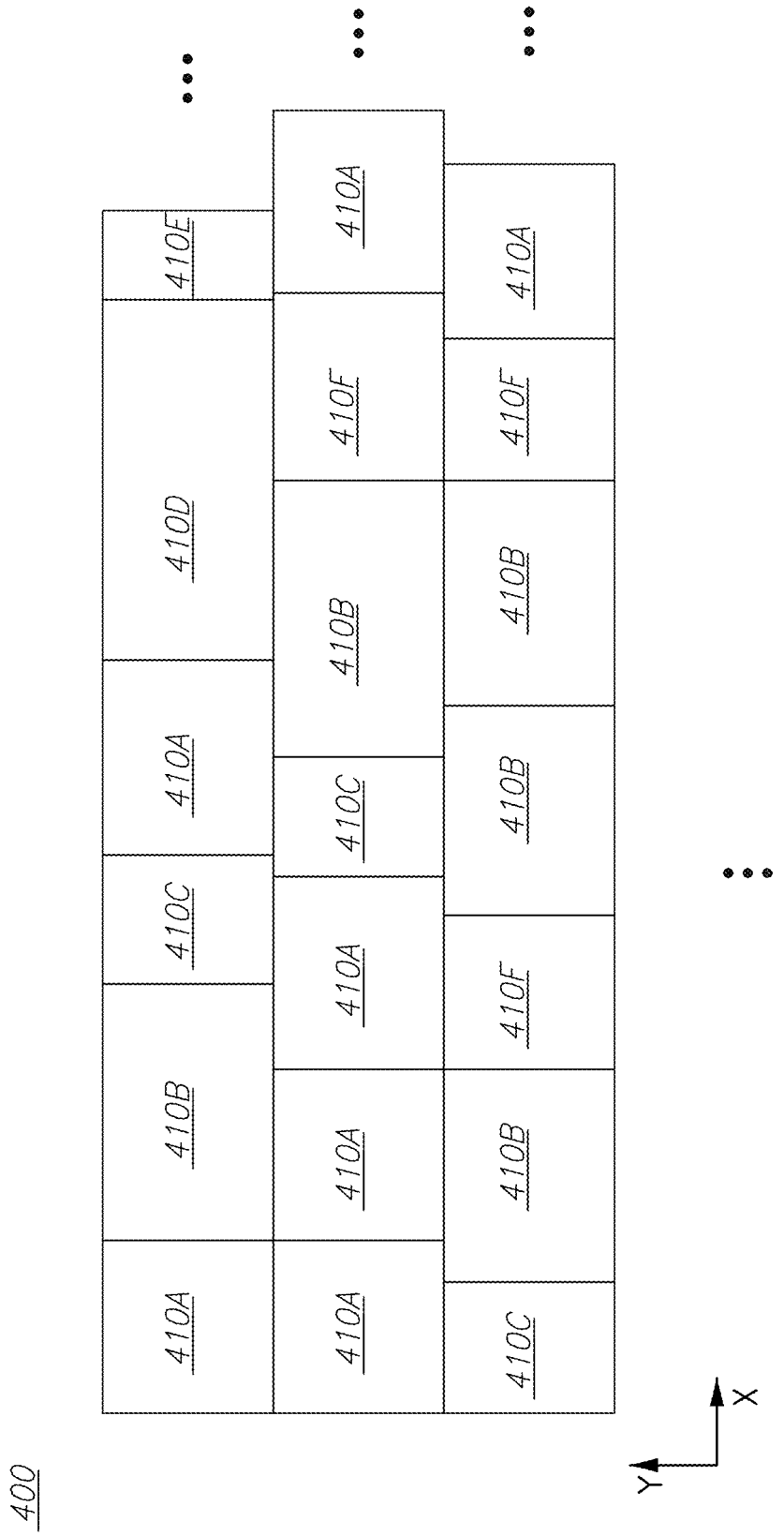

FIG. 6A illustrates schematically targets 400 as quasi-periodic in the sense that they exhibit periodicity along the Y axis that results from the general organization of the wafer (Y direction periodicity, possibly in the order of magnitude of the pitches of prior art targets) and a regularity along the X axis which results from the design principles of the wafer yet is not strictly periodic as designs 410A-410F etc. may not be periodic, and designs 410A-410F etc. may be alternated non-periodically. An evaluation of the degree of irregularity in the design of target 400 is presented below, and shown to still enable derivation of metrology signals and metrology parameters while taking into account the deviations introduced by the irregularities.

An important and surprising insight the inventors gain from the disclosed analysis is that devices and device sections may also be considered as quasi-periodic targets 400 and hence directly measured using metrology techniques and algorithms presented herein, under consideration of the effects introduced by their "irregularities" as considered with respect to strict periodicity. Moreover, the quasi-periodic nature of targets 400 enhances the applicability and efficiency of machine learning algorithms to measurements of targets 400.

Figure 6B:
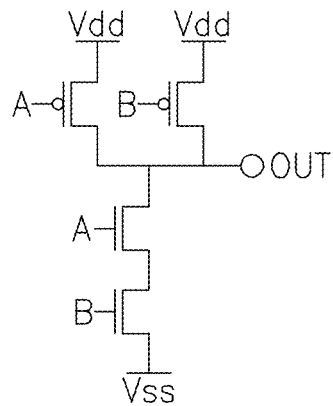
Figure 6B:
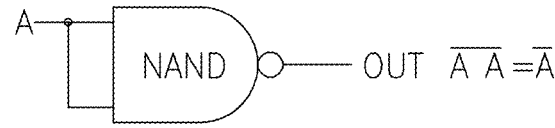
Figure 6B:
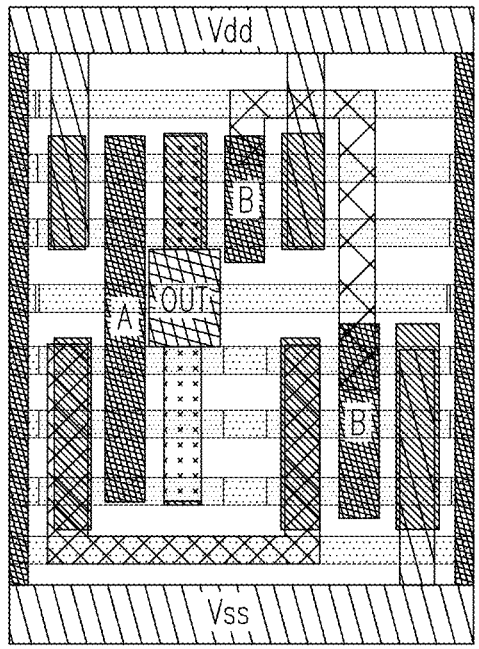
Figure 6B:
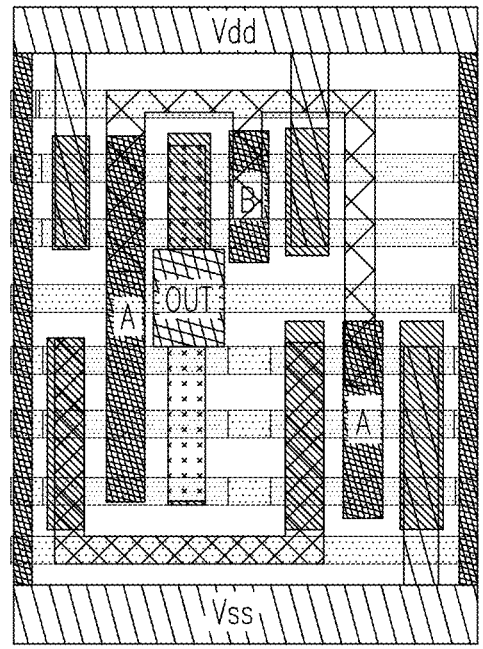
Figure 6C:
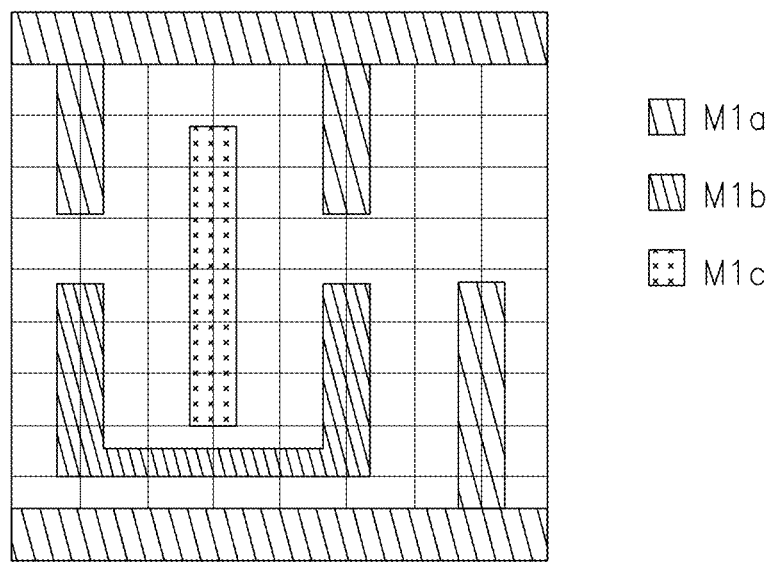
Figure 6D:
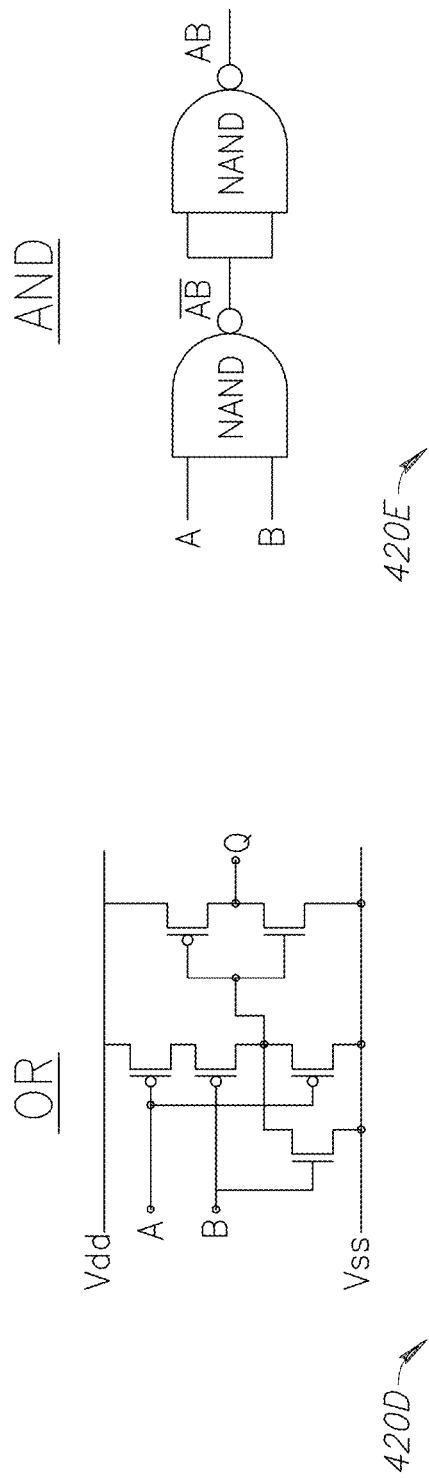
Figure 6D:
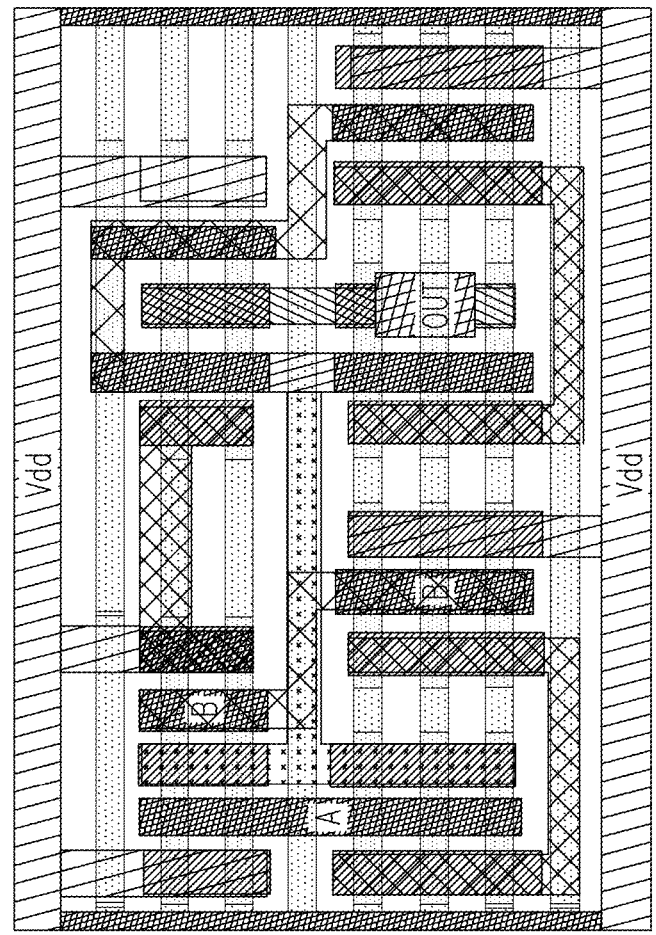
Figure 6D:
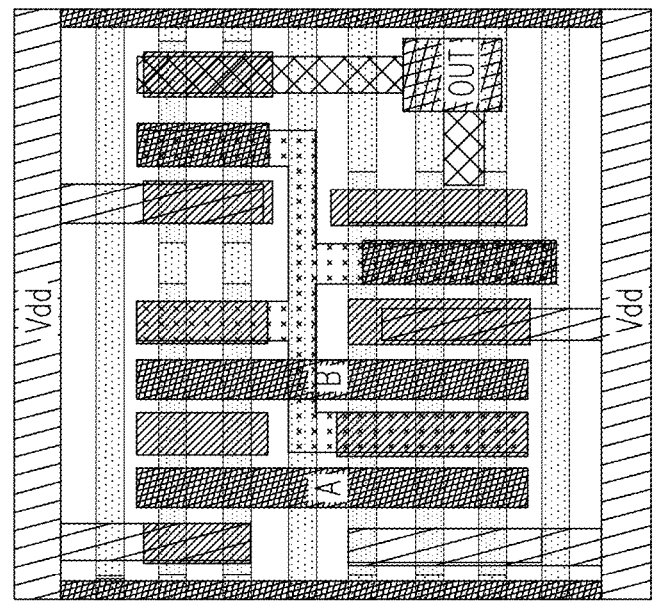
Figure 6E:
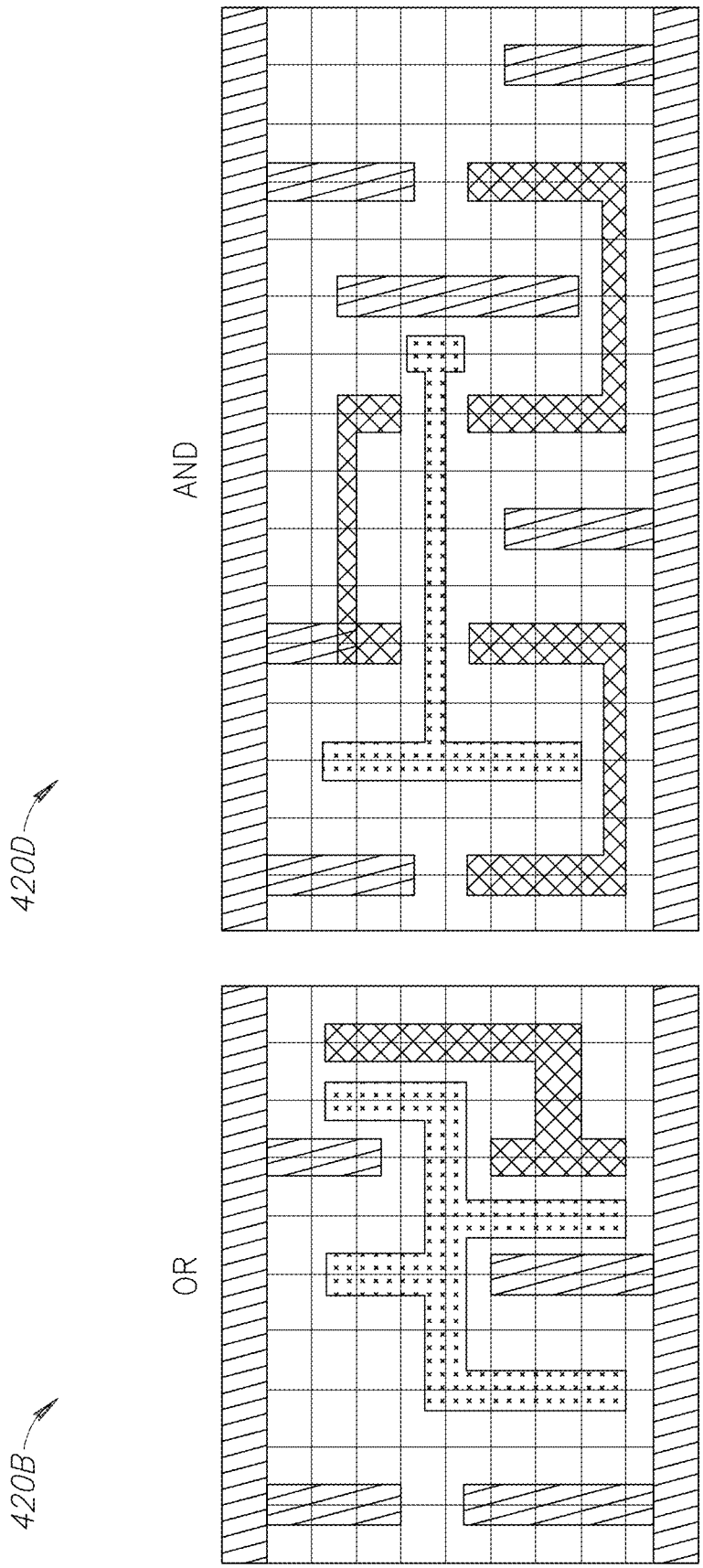
Figure 6F:
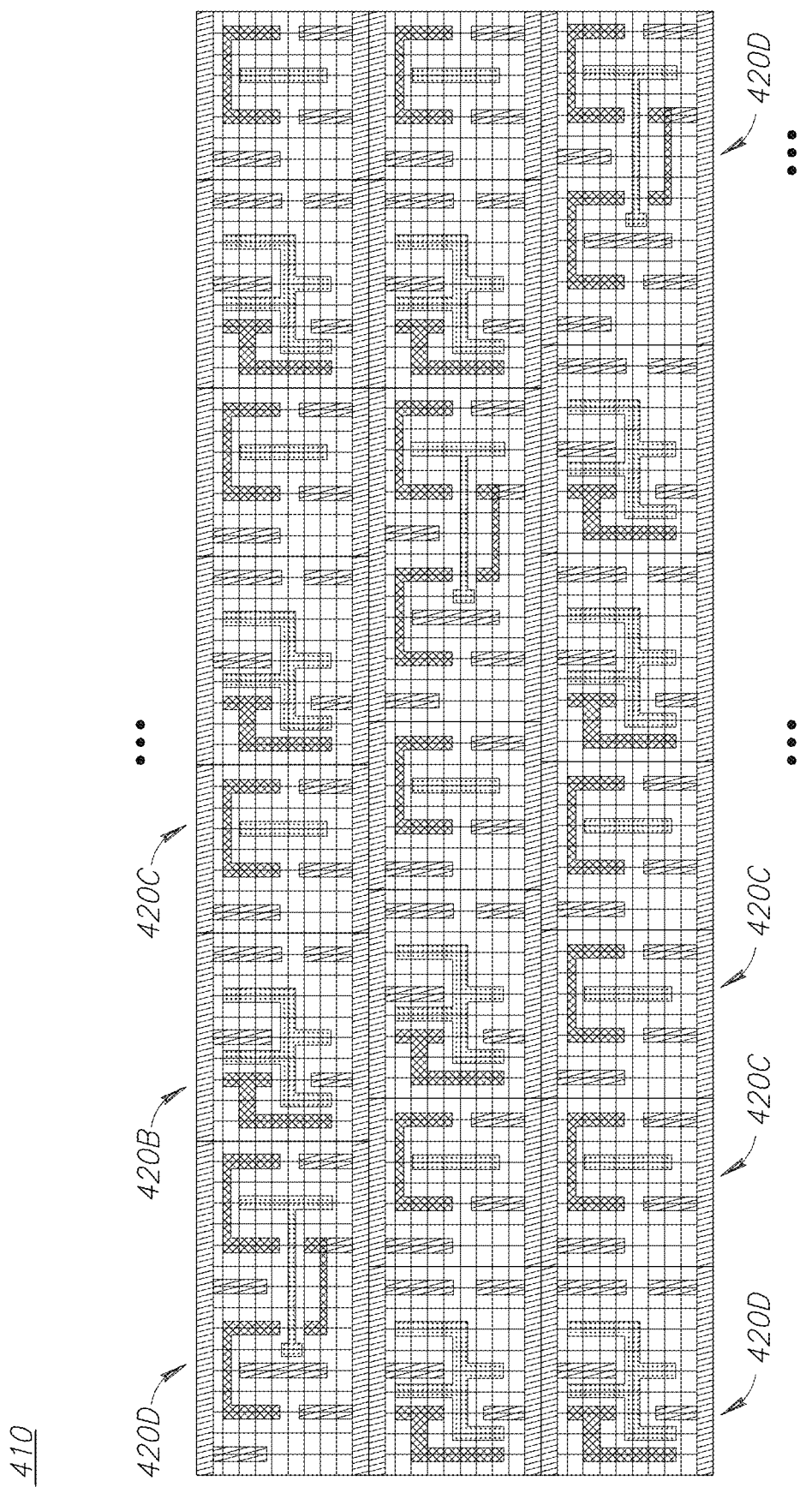

FIG. 6B schematically illustrates schemes 420B, 420C that represent schematic layouts of NAND and NOT gates respectively (the background grid serves merely to illustrate the periodicity of the pattern and is not an actual part of the pattern). In this exemplary process the M1 pattern is produced using three lithography steps (denoted LELELE with L standing for a lithography step and E standing for an etch step, the three steps applied to the same physical layer) to give the corresponding M1$a$, M1$b$ and M1$c$. FIG. 6C schematically illustrates only the M1 pattern which is common to 420B and 420C. Pattern 410C may be used to represent designs 420B, 420C in target 400. FIG. 6D schematically illustrates schemes 420D, 420E that represent schematic layouts of OR and AND gates respectively and FIG. 6E schematically illustrates corresponding M1 patterns 410B, 410D that may be used to represent designs 420D, 420E in target 400. Clearly, additional patterns may be used and integrated into target 400 according to various performance requirements and optimizations. It is noted that all illustrated designs 410A-410E illustrate the quasi-periodic nature of targets 400 which maintain a large degree of periodicity while introducing irregularities in the patterns that correspond to specific device designs. FIG. 6F schematically illustrates a combination of patterns 420B, 420C, 420D that yields quasi-periodic target 400 (the background grid serves merely to illustrate the periodicity of the target and is not an actual part of the target). It is noted that schemes 420A-E are used as a schematic adaptation of circuits such as those presented by U.S. Pat. No. 8,863,063 and they serve as non-limiting examples for possible schemes which may be used to derive corresponding patterns 410A-F and other patterns.

Figure 7A:
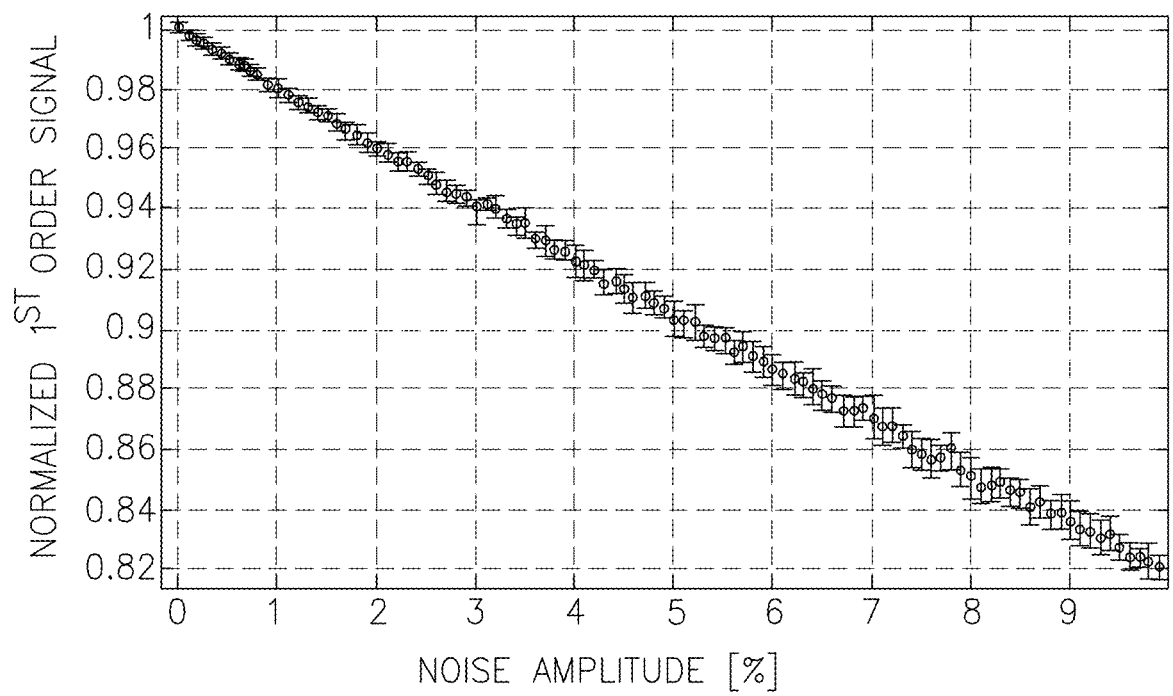
FIGS. 7A and 7B present simulation results of the effect of the noise introduced by the non-periodic target design on the first order amplitude, according to some embodiments of the invention.
Figure 7B:
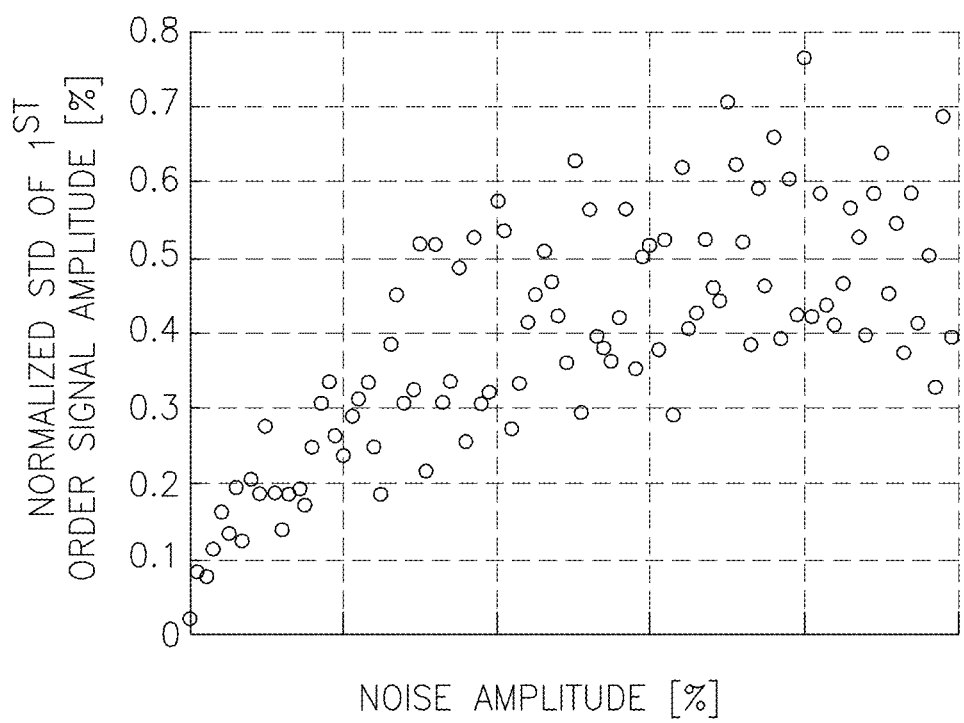

FIGS. 7A and 7B present simulation results of the effect of the noise introduced by the non-periodic target design on the first order amplitude, according to some embodiments of the invention. The noise represents irregularities in an essentially periodic structure, which was termed quasi-periodicity above. The following diagrams may be used to estimate to what extent the deviations from periodicity, which were exemplified in FIGS. 5A-5D and 6A-6F, degrade the metrology signals derived from target 400. The pupil plane signal (amplitude) of a grating with irregularities was calculated using Fraunhofer approximation. In OVL measurement, modification dS in the first order noise roughly changes the OVL by dS/A (A being the measurement sensitivity). Random noise was added to the grating in form of locations in which the amplitude was modified to zero. The random noise may be understood to represent irregularities due to differences that arise from specific patterns 410A-410F. The calculation was repeated for several different illumination beam locations. The effect of the noise magnitude was calculated for the first diffraction order amplitude distribution as a function of beam location. In FIG. 7A the error bars indicate the standard deviation of ten different beam locations. All values are normalized with respect to the unperturbed intensity. FIG. 7B shows explicitly the variability between the first order intensity when different locations were sampled (corresponding to the error bars of FIG. 7A). Different spatial distributions of the noisy points create an uncertainty of ca. 0.3% in the amplitude for a noise magnitude of 2%. FIGS. 7A and 7B illustrate that the deviation from strict periodicity result in a controllable noise that represents the irregularities in the target design, and may be taken into account as an inaccuracy factor when deriving metrology results from targets 400. Moreover, FIGS. 7A and 7B provide tools for handling noise due to irregularities in target structures, or in device designs which are used as targets, as suggested below. Machine learning algorithms may be configured with respect to such results and tools to converge quickly and provide accurate derivations.

This inaccuracy may be treated either algorithmically (for example using known symmetry properties of the signal) or by selecting measurement points which cancel out the symmetry breaking. The latter can be done for example by automatic analysis of the reticle. Machine learning algorithms may be applied to enhance derivation accuracy, reduce errors, speed up the overall measurement time, reduce the required number of cells and/or enable model-free on-the-fly metrology measurements of device-like targets. In certain embodiments, machine learning algorithm(s), may be trained on target designs which are based on metrology simulations, to match a behavior of the target designs to a specified device patterns' behavior.

Certain embodiments comprise metrology targets 400 having irregularly repeating units 410A-F along at least one direction of target 400 (possibly two perpendicular directions), wherein the units comprise device-like patterns having one or more (different) sets of lines and cuts, which are derived from respective device designs. For example, unit lengths, characteristics of lines in the unit and/or characteristics of cuts in the unit may be varied along the at least one direction of target 400. Target 400 may comprise two or more layers and may provide SCOL measurements which are likewise part of the present disclosure.

Figure 8:
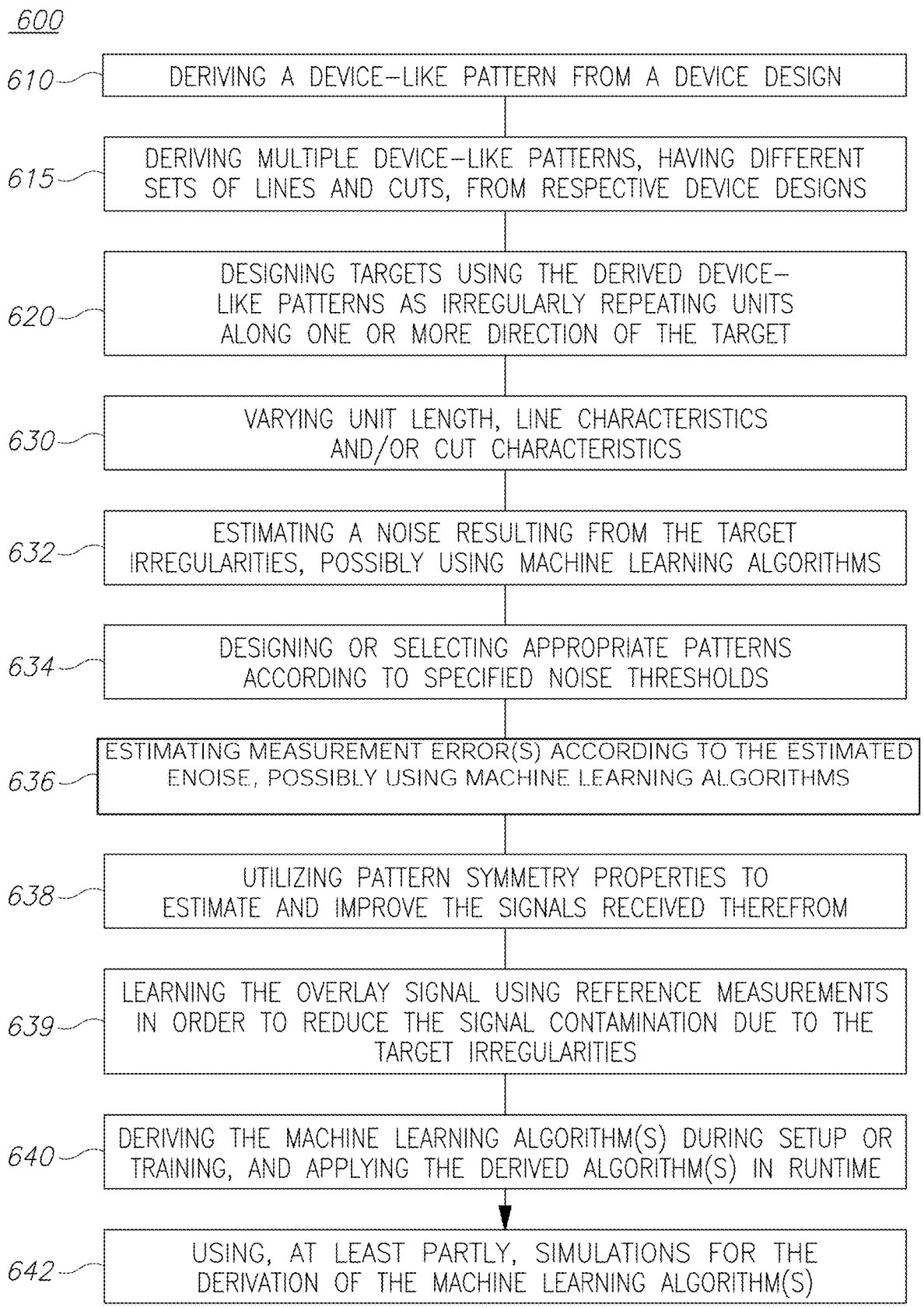
FIG. 8 is a high-level flowchart illustrating method, according to some embodiments of the invention.

FIG. 8 is a high-level flowchart illustrating method 600, according to some embodiments of the invention. Method 600 may be carried out at least partially by at least one computer processor. Computer program products and corresponding metrology modules are provided, which comprise a computer readable storage medium having computer readable program embodied therewith and configured to carry out method 600 at least partially. Target design files as well as metrology measurements of the targets are also provided.

Method 600 may comprise deriving a plurality of device-like patterns from a respective plurality of device designs, wherein device-like patterns comprise different sets of lines and cuts as exemplary specified pattern features (stage 615), and designing a metrology target using the derived device-like patterns as irregularly repeating units along at least one direction of the target (stage 620).

Method 600 may comprise varying along the at least one direction of the target at least one of: a unit length, characteristics of lines in the unit and characteristics of cuts in the unit (stage 630). The at least one direction may comprise two perpendicular directions of the target. The target may comprise at least two layers. Method 600 may comprise estimating, possibly using machine learning algorithms, a noise resulting from the target irregularities (stage 632), being the deviations from strict periodicity, and designing or selecting appropriate patterns according to specified noise thresholds (stage 634). Method 600 may comprise estimating, possibly using machine learning algorithms, a measurement error according to the estimated noise (stage 636). Method 600 may comprise utilizing pattern symmetry properties to estimate and improve the signals received therefrom (stage 638), as explained above (e.g., by treating the estimated noise algorithmically, using known symmetry properties of the signal and/or by selecting measurement points which cancel out the symmetry breaking, e.g., by automatic analysis of the reticle). Method 600 may comprise, e.g., following estimation 632, learning the overlay signal using reference measurements in order to reduce the signal contamination due to the target irregularities (stage 639), e.g., by identifying and reducing the signal contamination due to target irregularities from the overlay signal, using the machine learning algorithm(s).

In certain embodiments, method 600 may comprise deriving the machine learning algorithm(s) during setup or training, e.g., once, and applying the derived algorithm(s) in runtime (stage 640), possibly adjusting the derived algorithms if needed. Certain embodiments comprise using, at least partly, simulations for the derivation of the machine learning algorithm(s) (stage 642).

Avoiding Offsets in Device Targets

Returning to the basic SCOL assumption, it is assumed in U.S. Patent Application Publication No. 2016/0266505 that the measured differential signal (intensity difference between the first and respective minus first order) can be written as $D(n)=A(n)\cdot\varepsilon(n)$, with n being an index for the target cell (or target site) and $\varepsilon$ being the lateral offset between the two target periodic structures (e.g., gratings) in the measurement direction. Since both the sensitivity A and the relative offset (or OVL) may change between targets, both parameters should be calculated per target, and thus two measurements with the same sensitivity and OVL are required. If the sensitivity does not change, the OVL can be calculated using $OVL(n)=D(n)/A$, but in reality this does not hold results in big inaccuracy values.

In order to create two informative measurements, predetermined offsets are applied by design. These offsets may damage the electrical properties of the device and therefore cannot be applied on real devices. Since for many OVL alignments there is only one critical direction, as illustrated schematically in FIGS. 9 and 10 below, offsets in the orthogonal direction may be applied without damaging the device and without affecting the final (after etch) pattern. In conventional SCOL algorithms, offsets in the orthogonal direction do not help recover the sensitivity because the device pattern is not symmetric for rotation of 90° and, as a consequence, the measurement of the sensitivity in this direction does not necessarily correlate with the desired sensitivity. In the following derivations, linear approximation for the differential signal is used for simplicity, in a non-limiting manner. It is explicitly stated, that all methods disclosed below are valid also using higher order approximations for the differential signal and such applications are considered part of the present disclosure. The following methods use orthogonal offsets information to derive metrology parameters such as overlay, using orthogonal diffraction orders of the same target which do not require any offsets and using orthogonal target(s) with a different design, having offsets in a non-critical direction, both options enabling potential use of actual devices as targets.

FIGS. 9 and 10 are high-level schematic illustrations of device alignments 97, according to some embodiments of the invention. For example, FIGS. 9 and 10 may represent an alignment of contacts 711 to gates 712. FIGS. 9 and 10 schematically illustrate that the alignment along one direction (critical direction, denoted X) imposes much stricter overlay requirements (smaller OVL values) than the alignment along the perpendicular direction (non-critical direction, denoted Y). FIG. 10 also illustrates schematically the first diffraction order signals 98 in the pupil plane (pupil image, for an exemplary central illumination) of device 97, with +1 and −1 diffraction signals along the Y direction (the direction perpendicular to the critical direction) being similar to each other (and having rotational symmetry) while the +1 and −1 diffraction signals along the X direction (the critical direction) differ from each other, e.g., in intensity due to overlay symmetry breaking by elements 711.

In the following, the rotational symmetry along the non-critical measurement axis is utilized to enable measurement along the critical measurement axis without the present necessity to introduce designed offsets along the critical measurement axis. Moreover, machine learning algorithms may be applied to the measurements to enhance derivation accuracy, reduce errors, speed up the overall measurement time, reduce the required number of cells and/or enable model-free on-the-fly metrology measurements of device-like targets. In certain embodiments, machine learning algorithm(s), may be trained on target designs which are based on metrology simulations, to match a behavior of the target designs to a specified device patterns' behavior.

FIG. 11 is a high-level schematic illustration of leading diffraction orders along the non-critical and critical measurement directions, 716, 715 respectively, according to some embodiments of the invention. FIG. 11 illustrates a simplified model for a grating over grating at the two directions (represented as grating over grating model 725 and single grating model 726, as along the non-critical measurement directions the top grating is non-periodic, see FIG. 10).

It is noted that the simplified model is presented for explanatory reasons, and does not limit the invention. Gratings 701, 703 are to represent any periodic structure, and equivalent models may be used for multi-layered periodic structures. Moreover, the measured structures may be metrology targets and/or actual devices. For example, model 725 may be seen as representing effectively two-dimensional periodic structures while models 726 may be seen as representing effectively one-dimensional periodic structures.

Machine learning algorithms may be configured to improve results with respect to any such model (e.g., models 725, 726) and may possibly be configured to enhance or replace the use of these models. Results based on models 725, 726, may be used to guide or train the machine learning algorithms and also suggest the applicability and good convergence characteristics of the machine learning algorithms, while machine learning algorithms may enable avoiding some of the assumptions involved in the models.

In model 725, the electric field on the collection pupil in the X direction is the interference between the two diffraction modes illustrated in FIG. 11 and represented in equations presented and developed in U.S. Patent Application Publication No. 2016/0266505, which may be complemented or replaced by the machine learning algorithms. In model 726, the electric field E and the resulting measured intensity $I_p$ are expressed as component 77 reflected off lower grating 703, after passing through intermediate layer 702 and upper layer 701, the latter including the upper grating along the non-critical (non-measured) direction, and hence lacking periodicity, and are described analytically in U.S. Patent Application Publication No. 2016/0266505, which may be complemented or replaced by the machine learning algorithms.

As stated above, more complex models and calibration functions may be implemented using the same methodology and are considered part of the present disclosure. It is noted that the orthogonal diffraction order may also be used for calculation of geometrical properties of the target (for example: Critical Dimensions), with or without optical modeling. Machine learning algorithms may be configured to improve results with respect to any such model and may possibly be configured to enhance or replace the use of these models. Results based on these models may be used to guide or train the machine learning algorithms, and possibly avoid some of the assumptions involved in the models.

The disclosed analytic and machine learning methods (see also method 800 below) may be implemented in various ways to derive metrology measurements (of which the overlay was presented as non-limiting example) from various device and target designs. As a non-limiting example, FIG. 12 schematically illustrates one exemplary configuration for the application of the method.

Figure 12:
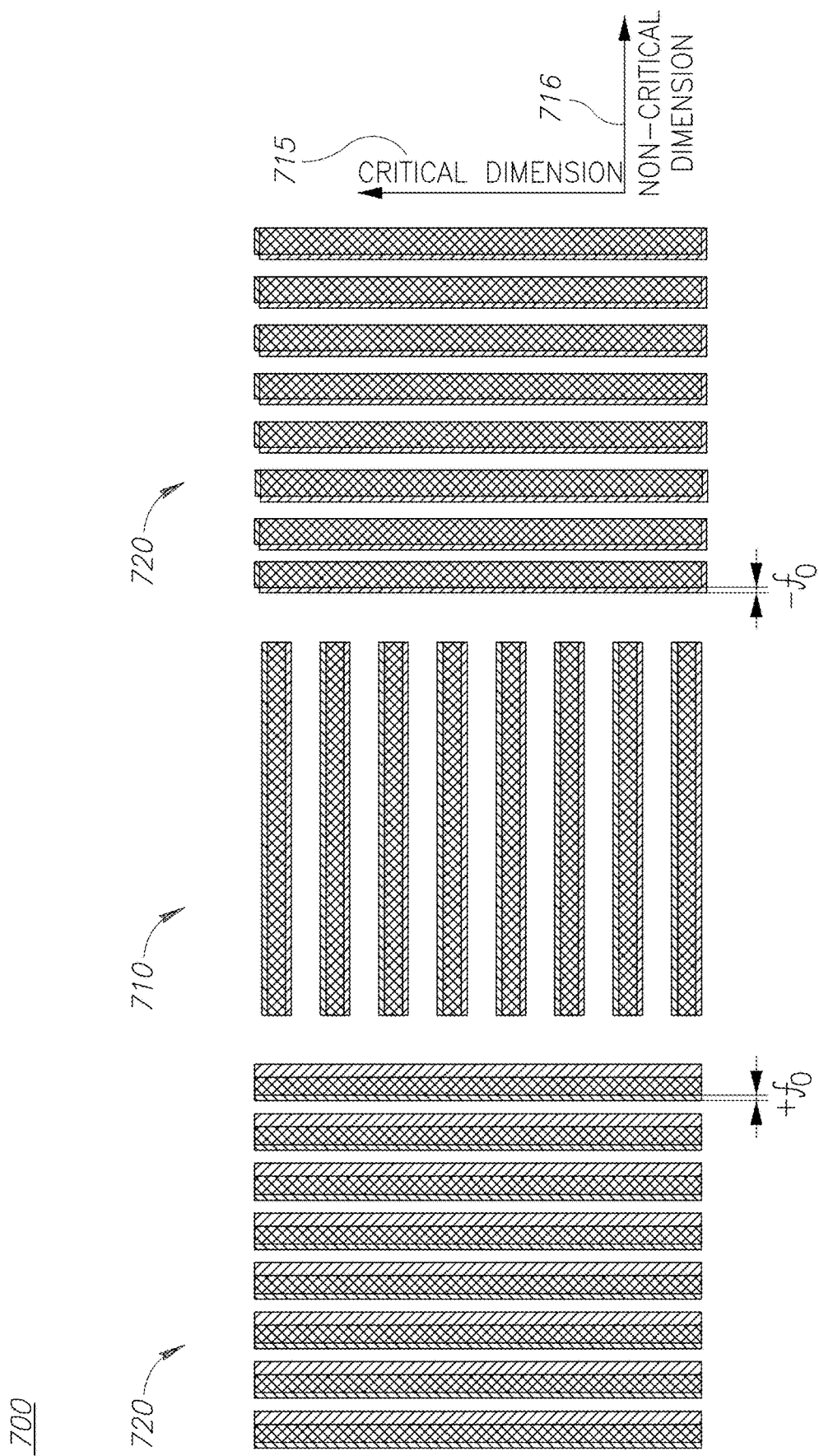
FIG. 12 is a high-level schematic illustration of a target incorporating an offset-less device portion, according to some embodiments of the invention.

FIG. 12 is a high-level schematic illustration of a target 700, incorporating an offset-less device portion, according to some embodiments of the invention. Target 700 may be designed to provide a sensitivity calculation without introduction of offsets along critical OVL dimension 715 (in cell 710), by using additional cell(s) 720 with pattern and offsets in different direction(s) 716 (e.g., perpendicular to the critical direction of cell 710). FIG. 12 illustrates in a non-limiting manner a three-cells designs in two layers, yet may be extended to a multi-layered design as explained above in the present disclosure, as well to quasi-periodic targets and devices as explained above. Target 700 enables overlay calculation along critical direction 715 without the need to introduce intended offsets in this direction. It is explicitly noted that cell 710 may be understood as representing at least a portion of an actual device design, the disclosed method thus enabling measuring devices directly, without introducing offsets at least along the critical direction of the device, possibly without introducing any offsets into the device design.

U.S. Patent Application Publication No. 2016/0266505 presents analytical methods applicable to measurements of central cell 710 for the Y differential signal calculation and of other (e.g., two) cells 720 with intended offsets $\pm f_0$, providing equations which express the sensitivity A of one target as being approximated by a function of a second nearby target. Machine learning algorithms may be used to enhance or replace such calculations, possibly to achieve any of reduction in the number of cell per target, extraction of more information and/or faster extraction of information from the measurements, and improved target designs, with relation to parameters of the machine learning algorithms. The machine learning algorithms may be trained on target designs which are based on metrology simulations, to match a behavior of the target designs to a specified device patterns behavior.

FIG. 13 presents a table with exemplary simulation results of the resulting sensitivity values for different combinations of first and second cells designs 710 and 720 respectively, according to some embodiments of the invention. The table presents the sensitivity as inaccuracy values (in nm, based on simulations), high sensitivities being above ca. 1 nm and low sensitivities below ca. 1 nm, and demonstrates the effectivity of the disclosed method. Method 800 was tested on fifteen different target designs and ninety process variations. The presented calculations, introduced in U.S. Patent Application Publication No. 2016/0266505, ensure the applicability and good convergence characteristics of the machine learning algorithms, while machine learning algorithms may enable improving results and possibly avoiding some of the assumptions involved in the analytic approach.

The number of cells in SCOL targets may be reduced using the methods described above. For example, relative offsets of N features in the same layer may be measured using N+1 cells instead of 2N cells—the first feature sensitivity and OVL are calculated using two cells, and all other designs may have a single cell for which the calibration sensitivity function may be used with respect to the first design. In certain embodiments, machine learning algorithms may be used to further reduce the number of cells, possibly even to single cell per target, with the machine learning algorithms configured to enable model-free on-the-fly optical overlay measurements of the single cell targets. Metrology procedures may also be improved, as after calculating the calibration function based on simulations, measurements and\or machine learning algorithms, the run sequence may comprise on-the-fly measurements of single cells and use of the orthogonal direction signal to calibrate the sensitivity, using the calculated calibration function. It is noted that in case of unstable processes, several different calibration targets may be used.

Figure 14:
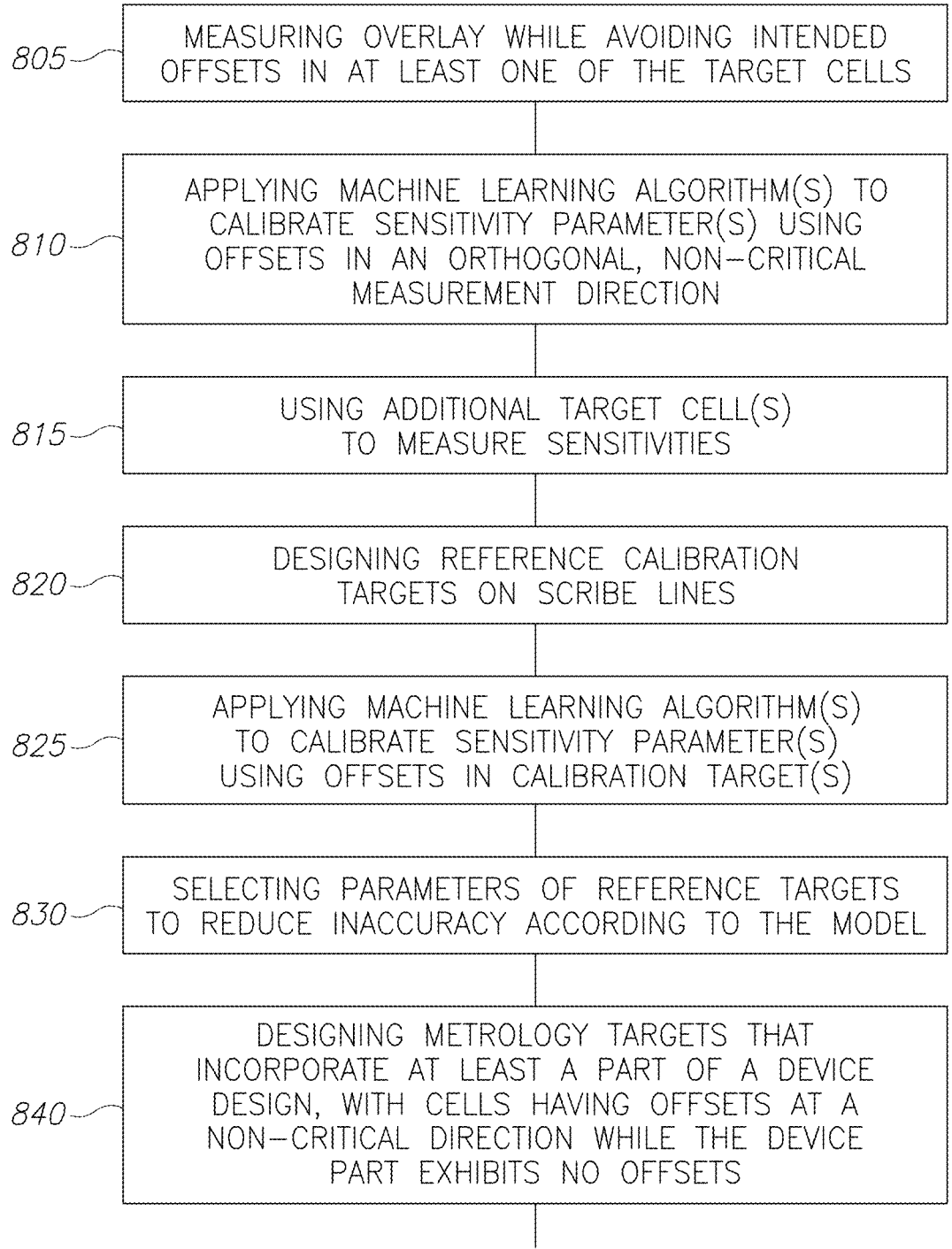
FIG. 14 is a high-level flowchart illustrating a method of measuring overlays without introducing intended shift along the critical directions, according to some embodiments of the invention.
Figure 14:
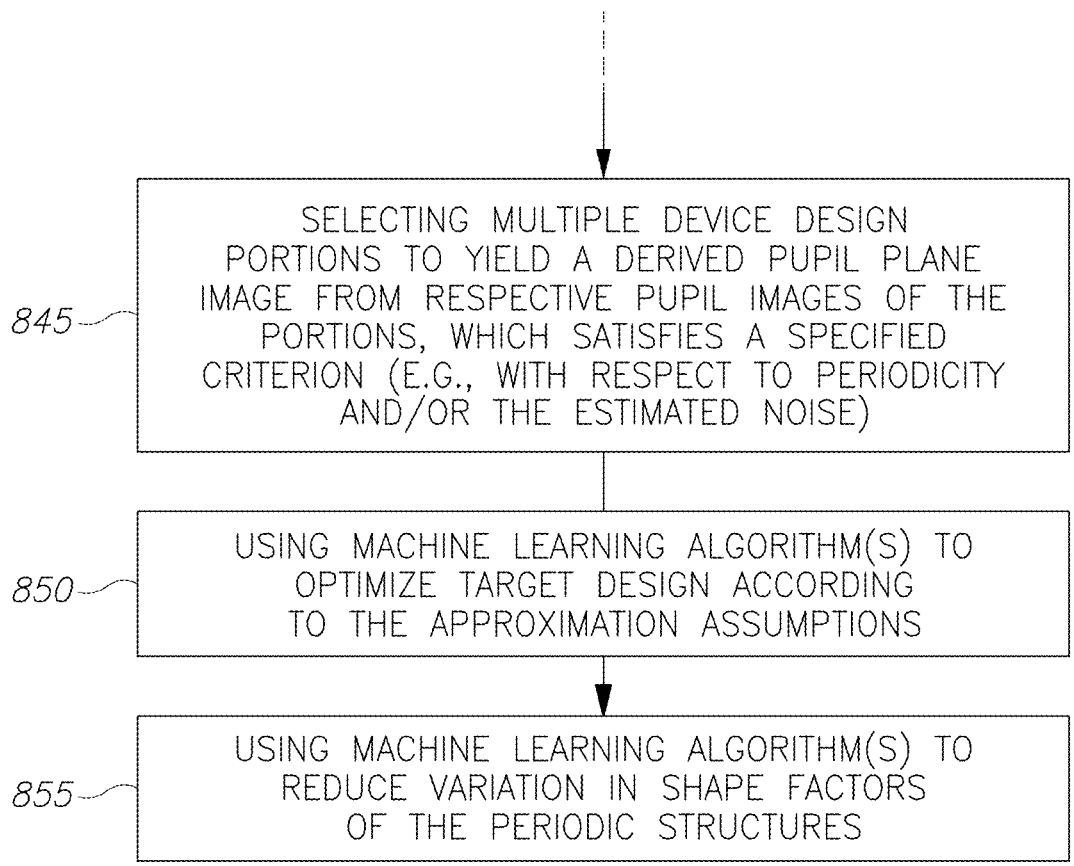

FIG. 14 is a high-level flowchart illustrating a method 800 of measuring overlays without introducing intended shift along critical directions, according to some embodiments of the invention. Method 800 may be implemented at least partly using machine learning algorithms. Method 800 may be at least partly implemented by at least one computer processor, e.g., in a metrology module. Certain embodiments comprise computer program products comprising a computer readable storage medium having computer readable program embodied therewith and configured to carry out of the relevant stages of method 800. Certain embodiments comprise target design files of respective targets designed by embodiments of method 800.

Method 800 comprises measuring overlay(s) while avoiding prior art introduction of intended offset(s) along a critical measurement direction in at least one of the target cells (stage 805). The measuring may be carried out in a model-free manner, possibly using machine learning algorithms. Method 800 may comprise applying machine learning algorithms to calibrate sensitivity parameter(s) using offsets in an orthogonal, non-critical measurement direction (stage 810), using the intensity of diffraction orders orthogonal to the critical measurement direction. Alternatively or complementarily, method 800 may comprise designing reference calibration targets on scribe lines (stage 820) and applying machine learning algorithms to calibrate sensitivity parameter(s) using offsets in calibration target(s) (stage 825). Method 800 may comprise selecting parameters of reference targets to reduce inaccuracy according to the model (stage 830). Method 800 may comprise using at least one additional target cell other than the at least one target cell to measure sensitivities (stage 815), e.g., by introduced offsets (along either or both critical and non-critical directions). The at least one additional target cell may be adjacent to the target cell(s) and/or be configured as separate calibration targets.

Method 800 may comprise designing metrology targets that incorporate at least a part of a device design, with cells having offsets at a non-critical direction while the device part exhibits no offsets (stage 840). In certain embodiments, multiple parts of an actual device may be used and combined into a single metrology measurement, method 800 further comprising selecting multiple device design portions to yield a derived pupil plane image from respective pupil images of the portions, which satisfies a specified criterion (e.g., with respect to periodicity and/or the estimated noise) (stage 845). For example, a pupil image used in the OVL calculation may be an average of few pupil images measured at different, possibly disparate device areas 50A. The selection of the combination may be pre-defined or be carried out automatically in order to effectively select the signal that provide certain characteristics, e.g., being most similar to a signal derived from a periodic target, exhibiting the lowest level of noise etc. Method 800 may comprise using machine learning algorithms to optimize target design according to the approximation assumptions (stage 850), e.g., by using machine learning algorithms to reduce variation in shape factors of the periodic structures (stage 855). Offsets may be introduced along the orthogonal, non-critical measurement direction of the device design and/or in adjacent, non-device additional cells and/or in calibration cells, e.g., on scribe lines.

The following aspects are provided by method 800 and the disclosure above. OVL sensitivity calibration may be carried out based on on-the-fly information from additional diffraction orders, which may include orthogonal diffraction orders and possibly derived by machine learning algorithms. OVL sensitivity calibration may be carried out based on on-the-fly information from a second target with a different design and/or from additional targets with different designs and/or diffraction orders reflectivity. These enable using OVL targets with no offsets in the critical measurement direction (enabling direct device measurements with no degradation in electrical functionality) according to the disclosed measurement methodology. Examples for target which were presented above include any of: a one-cell SCOL target for one direction (x or y) in which the sensitivity is calculated based on orthogonal direction reflectivity; a three-cell SCOL target composed of two standard cells for the first direction and a third cell for the orthogonal direction; a SCOL target for N designs along a single direction containing N+1 cells (instead of 2N cells)—a first design has two cells and all others have a single cell per design; and a SCOL target for N designs along a critical direction containing N+2 cells (instead of 2N cells)—a first design has two cells in the orthogonal non-critical direction and all others single cell without offsets per design. It is important to note that all the cells must not be adjacent to each other, for example the target may be a combination of cells located within the device active area and cells in its periphery.

The disclosure further provides OVL model-free measurements of targets with at least one of: No intended offsets; no defined unit cell; multiple (more than two) overlapping patterning (i.e., different lithography steps, possibly applied to the same physical layer); and measurement of device patterns using SCOL like algorithm (run time model-free approach). The methods enable optical measurements of device patterns after resist development as well as optical measurements of final and after etch device patterns. The disclosure further provides metrology-simulations-based target design optimization to match specific device patterns behavior as well as metrology simulations combined with lithography and/or process simulations for target design optimization to match specific device patterns behavior. Finally, model-free on-the-fly optical OVL measurements using a single cell and combined OVL and OCD (optical critical dimension) targets with model-free OVL algorithm are provided (possibly requiring measurements using multiple hardware configurations, as explained above).

Figure 15:
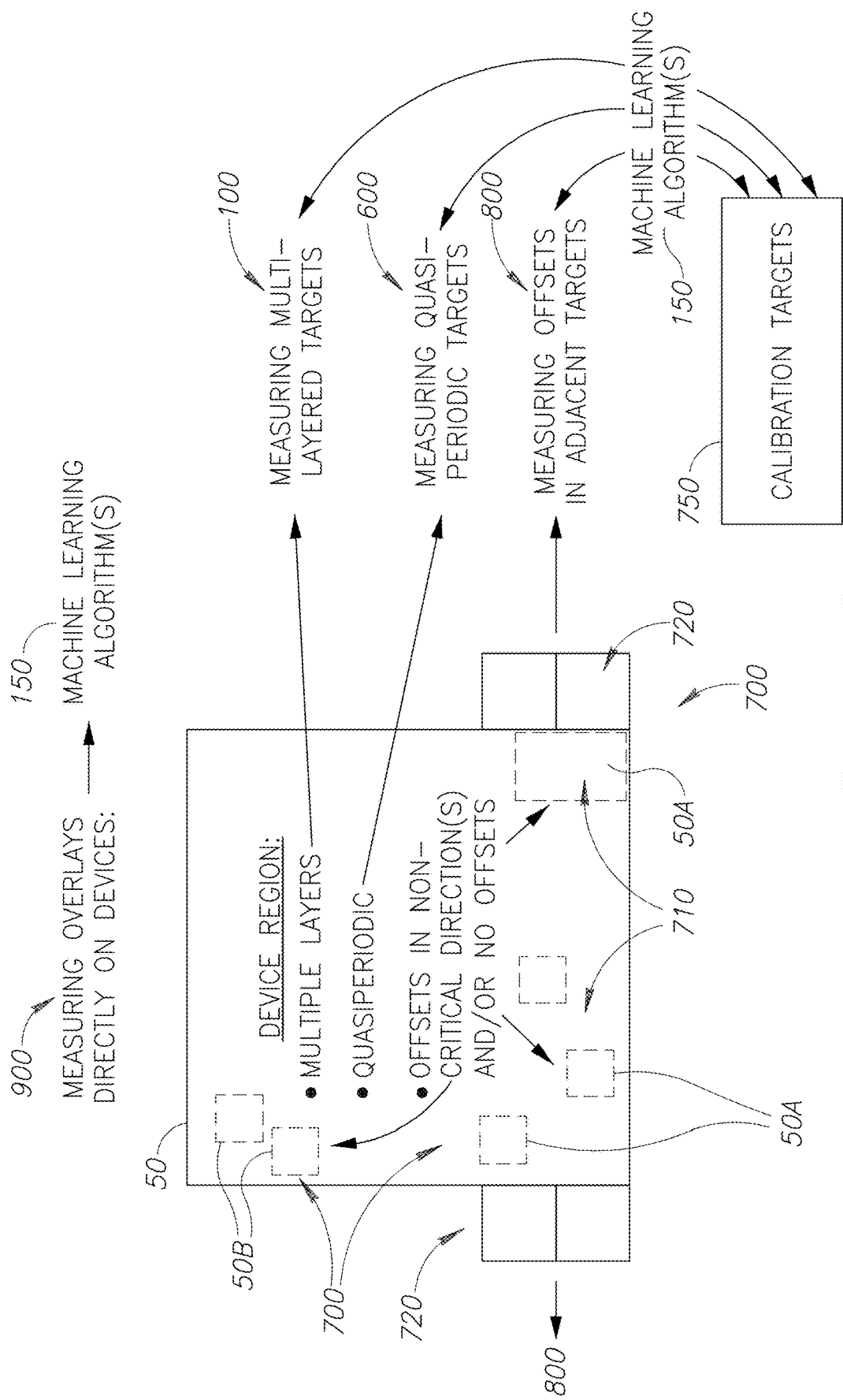
FIG. 15 is a high-level schematic illustration of a composite device target, according to some embodiments of the invention.

FIG. 15 is a high-level schematic illustration of a composite device target 700, according to some embodiments of the invention. FIG. 15 illustrates in a schematic manner, the combination of the concepts disclosed above to yield direct metrology measurements in a device area 50 (see below method 900). As illustrated in FIG. 15, a device region may be regarded as being multi-layered, quasi-periodic and as having no offsets and/or offsets only in non-critical direction only. This understanding is surprising, as metrology target designs are usually very different from device designs. However, the inventors have found out, that from this perspective and/or by selecting specific device regions according to these criteria, actual device regions may be successfully treated and measured as metrology targets or parts thereof and provide useable metrology results, directly relating to device characteristics. By considering and/or selecting device regions as being multi-layered, quasi-periodic in the sense described above and as having no offsets and/or offsets only in non-critical direction only—the respective device regions may be used as target or target parts by applying methods 100, 600 and 800 respectively, possibly enhanced using machine learning algorithms 150, as illustrated schematically in FIG. 15.

For example, target 700 may comprise at least one region 50A of device 50 as part 710 of the measured target in which no offsets are introduced (at least along critical directions with respect to the device's functionality) and adjacent cells 720 which have intended offsets that may be used to derive device overlays according to pre-calculated sensitivity parameters and/or calibration function(s). FIG. 15 schematically illustrates an option of selecting one region 50A as target part 710 adjacent to cells 720, as well as an option of selecting multiple regions 50A as target part, possibly but not necessarily adjacent to cells 720. Regions 50A may be selected to yield a derived pupil plane image from respective pupil images of regions 50A, e.g., an average or a weighted average thereof, which satisfies a specified criterion such as a noise threshold, a periodicity threshold or any algorithmic threshold used to optimize the selection in view of the quality of the derived signals and related overlay derivations.

Alternatively or complementarily, target 700 may comprise at least one region 50B of device 50 as target 700 or as a part thereof, which has intended offsets introduced along non-critical direction(s) of the device design at specific region 50B. Such intended offsets may be selected to provide useful metrology information (e.g., sensitivity parameter A) without damaging the device performance (see explanation and derivation above, corresponding to FIGS. 9-11). Target 700 may further comprise adjacent cells 720 which have intended offsets that may be used to derive device overlays according to pre-calculated sensitivity parameters and/or calibration function(s).

Direct device measurements may further utilize calibration targets 750, set e.g., on scribe lines, which calibrate any of the effects of multi-layers, quasi-periodicity and sensitivity, as explained above. Moreover, methods 100, 600 and/or 800 (possibly carried out at least partly and/or enhanced using machine learning algorithms 150) may be implemented synergistically as a method 900 described below, to enable direct measurements of metrology parameters on devices which are multi-layered and non-periodic without introducing offsets along critical direction of the device designs.

Figure 16:
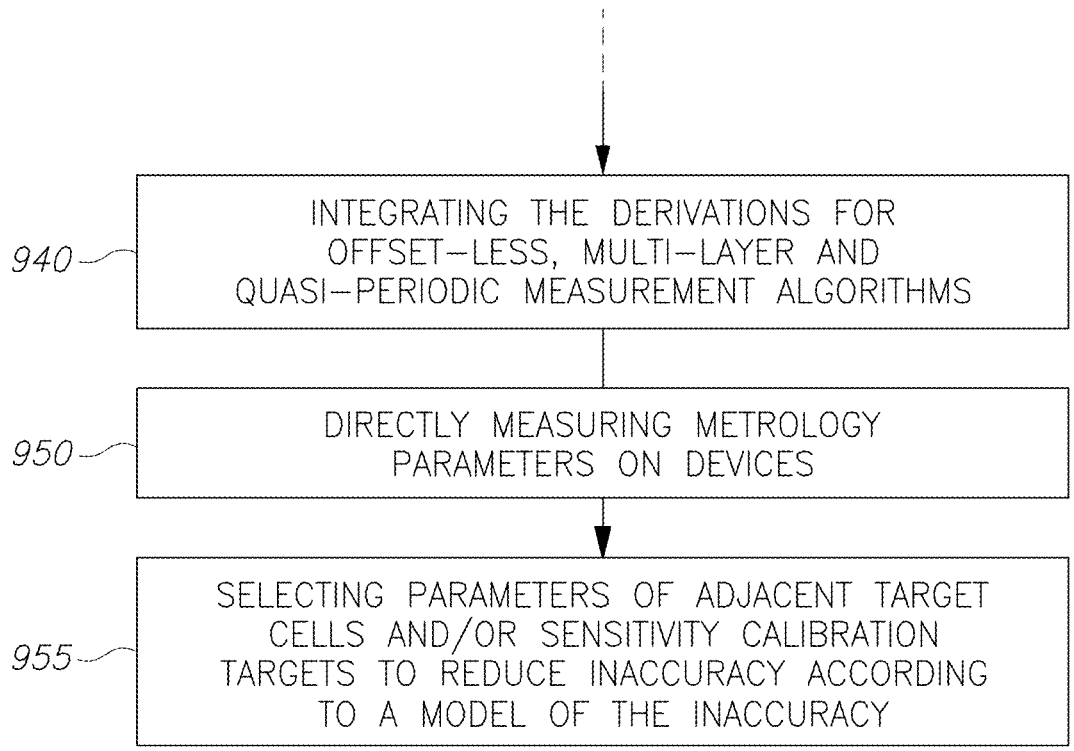
FIG. 16 is a high-level flowchart illustrating an integrative method of measuring device overlays directly on the device, according to some embodiments of the invention.

FIG. 16 is a high-level flowchart illustrating an integrative method 900 of measuring device overlays directly on the device, according to some embodiments of the invention. Method 900 may be carried out at least partly and/or enhanced using machine learning algorithms. Method 900 may be at least partly implemented by at least one computer processor, e.g., in a metrology module. Certain embodiments comprise computer program products comprising a computer readable storage medium having computer readable program embodied therewith and configured to carry out of the relevant stages of method 900. Certain embodiments comprise target design files of respective targets designed by embodiments of method 900.

Method 900 may comprise using reference calibration targets and/or device-adjacent cells with intended offsets to enable direct measurement of device parts without introducing offsets into the device design (stage 910), e.g., implementing method 800. Method 900 may comprise applying machine learning algorithms to calibrate sensitivity using at least one of: introducing offsets along non-critical direction, using adjacent target cells with introduced offsets, and using sensitivity calibration targets on scribe lines (stage 915), as explained above.

Method 900 may comprise extending the cell designs to multi-layered measurements (stage 920), e.g., implementing method 100 in any of its variations 100A-D, possibly enhanced by machine learning algorithms. Method 900 may comprise configuring additional targets to provide layer-specific metrology parameters using multi-layered (N) target cells (having N>2 overlapping layers) comprising at least one of: N cell pairs, each pair with opposite offsets at a different layer; N cells with selected intended offsets; N−1 or fewer cells with selected intended offsets configured to utilize pupil information; and calibration targets alongside overlay targets with down to 2 cells (stage 925), as explained above. In certain embodiments, targets may comprises a single cell per target, with the machine learning algorithm(s) being further configured to enable model-free on-the-fly optical overlay measurements of the single cell.

Method 900 may comprise measuring quasi-periodic design patterns directly while managing and bounding resulting inaccuracies (stage 930), e.g., implementing method 600. Method 900 may comprise measuring metrology parameters from at least a portion of a device design that is selected to have a plurality of irregularly repeating units, having different sets of lines and cuts as exemplary specified features, along at least one direction of the portion (stage 935), as explained above.

Method 900 may comprise integrating the derivations for offset-less, multi-layer and quasi-periodic measurement algorithms (stage 940) to directly measuring metrology parameters on devices (stage 950).

Method 900 may further comprise selecting parameters of the adjacent target cells and/or the sensitivity calibration targets to reduce inaccuracy according to a model of the inaccuracy (stage 955), as illustrated above.

Corresponding metrology targets comprise at least a portion of a device design 710 that is selected to have a plurality of irregularly repeating units (e.g., as schematically exemplified in patterns 420A-E), having different sets of lines and cuts (e.g., as schematically exemplified in targets 400), along at least one direction of the portion, and a plurality of additional cells comprising multi-layer calibration cells (e.g., as schematically exemplified in targets 200 and 300)

and sensitivity calibration cells (e.g., as schematically exemplified in targets 700 and 750). The multi-layer calibration cells may comprise any of (see FIG. 1A): N cell pairs, each pair with opposite offsets at a different layer; N cells with selected intended offsets; N cells with selected intended offsets (or possibly fewer cells depending on the measurement conditions and on algorithms used) configured to utilize pupil information; and N-cell calibration targets alongside overlay targets with N−1 cells and optionally down to 2 cells, depending on calibration conditions and algorithmic complexity. The sensitivity calibration cells may comprise at least two additional cells having intended offsets along the critical measurement direction of the at least one target cell, e.g., additional cells having an orthogonal critical measurement direction with respect to the at least one target cell. The at least two additional cells may be adjacent to the device portion as additional cells 720 are. Respective metrology measurements of the disclosed targets are also considered part of the present disclosure.

Figure 17:
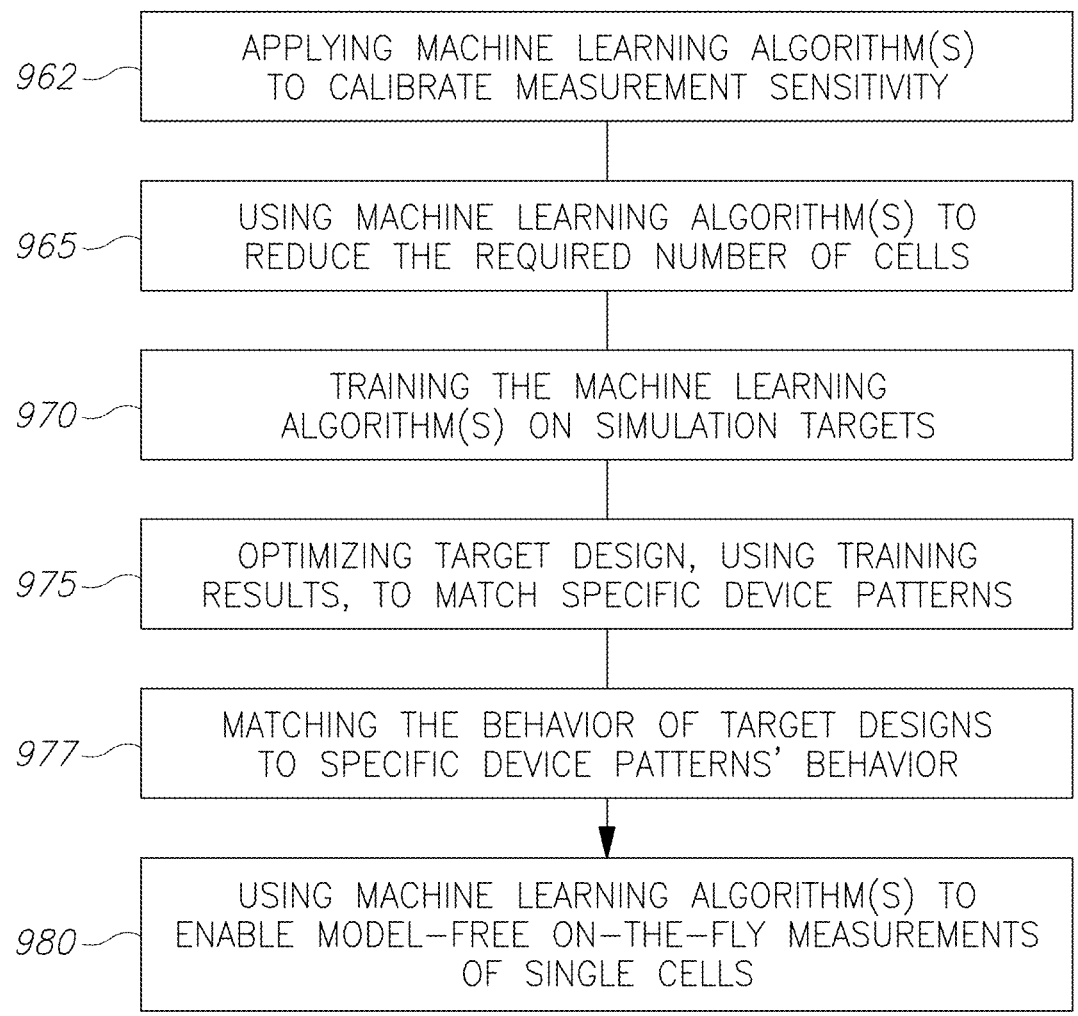
FIG. 17 is a high-level flowchart illustrating a method of applying machine learning algorithms to any of the disclosed methods, according to some embodiments of the invention.

FIG. 17 is a high-level flowchart illustrating a method 960 of applying machine learning algorithms to any of the disclosed methods, according to some embodiments of the invention. Method 960 and/or stages thereof may be integrated in any of the methods disclosed above, and may be carried out at least partly and/or enhanced using machine learning algorithms. Method 960 may be at least partly implemented by at least one computer processor, e.g., in a metrology module. Certain embodiments comprise computer program products comprising a computer readable storage medium having computer readable program embodied therewith and configured to carry out of the relevant stages of method 960. Certain embodiments comprise target design files of respective targets designed by embodiments of method 960.

Method 960 and/or any of methods 100, 600, 800 and 900 may comprise any of the following stages: applying machine learning algorithm(s) to calibrate measurement sensitivity (stage 962), using machine learning algorithm(s) to reduce the required number of cells (stage 965), training the machine learning algorithm(s) on simulation targets (stage 970), optimizing target design, using training results, to match specific device patterns (stage 975), matching the behavior of target designs to specific device patterns' behavior (stage 977) and using machine learning algorithm(s) to enable model-free on-the-fly measurements of single cells (stage 980).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram portion or portions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram portion or portions.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram portion or portions.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of directly measuring metrology parameters on devices, the method comprising:
    measuring at least one metrology parameter from a portion of a device design that is selected to have a plurality of irregularly repeating units, having specified features, along at least one direction of the portion of the device design, and
    applying at least one machine learning algorithm to calibrate sensitivity using at least one of: an intensity of diffraction orders orthogonal to the at least one direction, introduced offsets along a non-critical direction, target cells with introduced offsets adjacent to the portion of the device design, or at least one sensitivity calibration target,
    wherein the measuring is carried out scatterometrically on a plurality of targets to provide layer-specific metrology parameters, at least one of the plurality of targets being part of the portion of the device design having N>2 overlapping layers, wherein the plurality of targets comprises less than 2N cells, wherein N is an integer greater than two, wherein the applying at least one machine learning algorithm is further configured to extract overlay information from the less than 2N cells, and wherein the plurality of targets comprises at least one of: N cell pairs, each pair having opposite offsets at a different layer; N cells with selected intended offsets; N or fewer cells with selected intended offsets configured to utilize pupil information; or N-cell calibration targets alongside between N−1 and two overlay targets.

2. The method of claim 1, wherein the at least one machine learning algorithm is applied to enable model-free on-the-fly optical overlay measurements of a single cell.

3. The method of claim 1, wherein the introduced offsets are orthogonal to a critical direction of the portion of the device design and wherein the measuring the at least one metrology parameter is carried out without introducing an intended offset along the critical direction of the portion of the device design.

4. The method of claim 3, wherein a measurement direction of adjacent target cells is perpendicular to the critical direction of the portion of the device design.

5. The method of claim 1, further comprising selecting parameters of at least one of adjacent target cells and the at least one sensitivity calibration target, to reduce inaccuracy according to parameters of the at least one machine learning algorithm.

6. The method of claim 1, wherein the at least one sensitivity calibration target is on scribe lines.

7. The method of claim 1, wherein the at least one machine learning algorithm is applied to learn an overlay signal using reference measurements and the method further comprises identifying and reducing a signal contamination due to target irregularities from the overlay signal, using the at least one machine learning algorithm.

8. The method of claim 1, wherein the at least one machine learning algorithm is applied to estimate a noise in the measurements of the at least one metrology parameter, wherein the noise results from irregularities of the portion of the device design, being its deviations from strict periodicity, and to estimate a measurement error accordingly.

9. The method of claim 8, wherein the at least one portion of the device design comprises a plurality of device design portions selected to yield a derived pupil plane image or a derived field plane image from respective pupil images of the portion of the device design, which satisfies a specified criterion with respect to the estimated noise.

10. The method of claim 1, wherein the plurality of targets comprise N cells with selected intended offsets, at least one of the cells being part of the portion of the device design and having a zero intended offset.

11. The method of claim 1, wherein the plurality of targets comprise N or fewer cells with selected intended offsets configured to utilize pupil information, at least one of the cells being part of the portion of the device design and having a zero intended offset.

12. The method of claim 1, wherein the plurality of targets comprise N-cell calibration targets alongside between N−1 and two overlay targets, at least one of the overlay targets being part of the portion and having a zero intended offset.

13. The method of claim 1, wherein differential signals to of which the at least one machine learning algorithm is applied during the measuring.

14. The method of claim 13, wherein the measuring of the differential signals is carried out sequentially for consecutive layers of the plurality of targets.

15. The method of claim 14, wherein the measuring of the differential signals is carried out simultaneously for the N layers, by carrying out the measuring at a pupil plane with respect to the plurality of targets and using measurements of a plurality of pixel positions at the pupil plane.

16. The method of claim 1, further comprising deriving, based on parameters of the at least one machine learning algorithm, at least one device-like pattern from a respective at least one device design, and designing at least one of the plurality of targets to have regions between periodic structures thereof at least partially filled by the at least one device-like pattern.

17. The method of claim 16, further comprising designing the at least one of the plurality of targets to have sub-regions between elements of the periodic structures at least partially filled by the at least one device-like pattern.

18. A computer program product comprising a non-transitory computer readable storage medium having computer readable program embodied therewith and configured to carry out at least partially the method of claim 1.

19. A metrology module comprising the computer program product of claim 18.

20. A target design file of targets designed according to parameters of the at least one machine learning algorithm applied in the method of claim 1.

* * * * *